(12) United States Patent
Kim et al.

(10) Patent No.: US 12,312,695 B2
(45) Date of Patent: May 27, 2025

(54) ETCHANT COMPOSITION, AND METHOD FOR MANUFACTURING METAL PATTERN AND THIN FILM TRANSISTOR SUBSTRATE USING THE SAME

(71) Applicant: Samsung Display Co., Ltd., Yongin-si (KR)

(72) Inventors: Bong-Kyun Kim, Hwaseong-si (KR); Changwoo Kwon, Seoul (KR); Seungbo Shim, Asan-si (KR); Ilbae Ahn, Asan-si (KR); Seokjun Jang, Cheonan-si (KR); Jinsuek Kim, Hwaseong-si (KR); Ji-Hun Park, Asan-si (KR); Yong-Su Lee, Cheonan-si (KR); Yangil Jeon, Asan-si (KR); Gyu-Po Kim, Incheon (KR); Sang-Woo Kim, Seongnam-si (KR); Hyun-Cheol Shin, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/566,427

(22) Filed: Dec. 30, 2021

(65) Prior Publication Data

US 2022/0205110 A1 Jun. 30, 2022

(30) Foreign Application Priority Data

Dec. 30, 2020 (KR) .......................... 10-2020-0188136
Dec. 30, 2021 (KR) .......................... 10-2021-0193493

(51) Int. Cl.
*C23F 1/26* (2006.01)
*C23F 1/18* (2006.01)
*H01L 21/027* (2006.01)

(52) U.S. Cl.
CPC .................. *C23F 1/26* (2013.01); *C23F 1/18* (2013.01); *H01L 21/0274* (2013.01)

(58) Field of Classification Search
CPC ...... C23F 1/26; C23F 1/18; C23F 1/02; H01L 21/0274; H01L 21/32134
(Continued)

(56) References Cited

U.S. PATENT DOCUMENTS 9,023,735 B2  5/2015  Kim et al.
9,546,321 B2  1/2017  Barnes et al.
(Continued)

FOREIGN PATENT DOCUMENTS

KR  10-2004-0083157 A  10/2004
KR  10-2010-0040010 A  4/2010
(Continued)

*Primary Examiner* — Duy N Deo
(74) *Attorney, Agent, or Firm* — Womble Bond Dickinson (US) LLP

(57) ABSTRACT

An etchant composition of an embodiment may etch a multi-layered film of titanium/copper and may include about 5 wt % to about 20 wt % of persulfate, about 0.1 wt % to about 5 wt % of phosphoric acid or phosphate, about 0.01 wt % to about 2 wt % of a carbonyl ring compound, about 0.01 wt % to about 1 wt % of a 3-nitrogen ring compound, about 0.1 wt % to about 2 wt % of a 4-nitrogen ring compound, about 0.1 wt % to about 0.9 wt % of a fluorine compound, about 0.1 wt % to about 0.5 wt % of hydrogen about 1 wt % to about 3 wt % of a zwitterionic compound, and sulfate, water which is included in an amount that makes the total weight of the entire composition about 100 wt %.

17 Claims, 12 Drawing Sheets

(58) Field of Classification Search
USPC .............................................. 252/79.1–79.4
See application file for complete search history.

(56) References Cited

U.S. PATENT DOCUMENTS

| | | | |
|---|---|---|---|
| 10,138,117 | B2 | 11/2018 | Chen et al. |
| 10,910,412 | B2 * | 2/2021 | Kim .................. H01L 21/32134 |
| 2008/0224092 | A1 | 9/2008 | Choung et al. |
| 2015/0087148 | A1 * | 3/2015 | Kim .................. H01L 21/30604 |
| | | | 252/79.3 |
| 2016/0032186 | A1 | 2/2016 | Chen et al. |
| 2019/0288015 | A1 * | 9/2019 | Kim ........................... C23F 1/18 |
| 2020/0172807 | A1 * | 6/2020 | Kim .................... H01L 27/1259 |

FOREIGN PATENT DOCUMENTS

| | | | |
|---|---|---|---|
| KR | 10-2011-0121121 | A | 11/2011 |
| KR | 10-1146099 | B1 | 5/2012 |
| KR | 10-1310310 | B1 | 9/2013 |
| KR | 10-2014-0019108 | A | 2/2014 |
| KR | 10-2014-0132708 | A | 11/2014 |
| KR | 10-2016-0037998 | A | 4/2016 |
| KR | 10-1661072 | | 9/2016 |
| KR | 10-2017-0066299 | A | 6/2017 |
| KR | 10-1745721 | | 6/2017 |
| KR | 10-2002131 | B1 | 7/2019 |
| KR | 10-2019-0110171 | A | 9/2019 |
| KR | 20200011394 | A | 2/2020 |
| WO | WO 2016/042408 | A2 | 3/2016 |

* cited by examiner

FIG. 1A
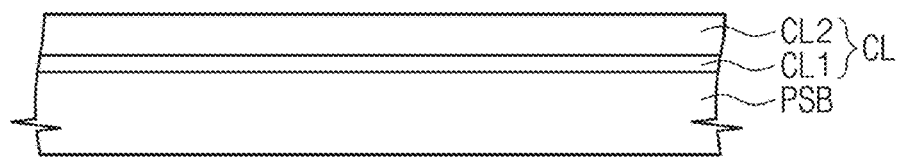
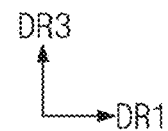
FIG. 1B
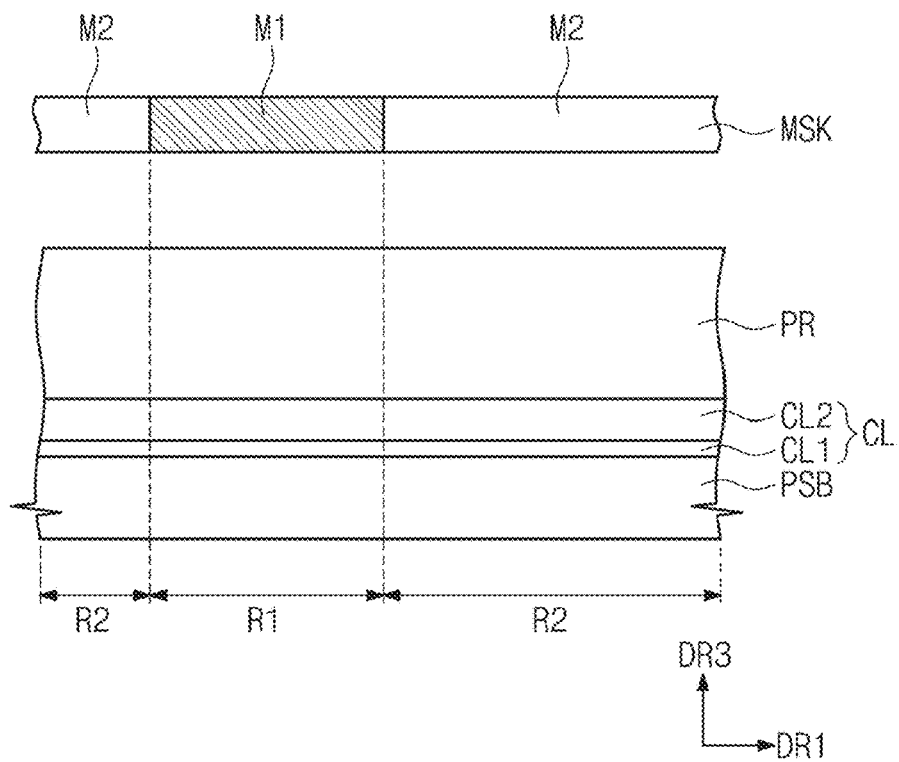

FIG. 4A
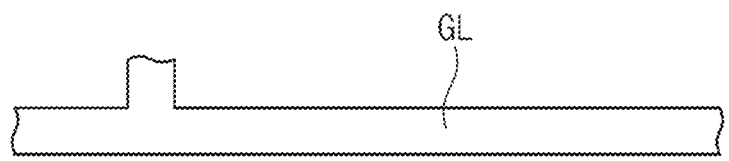
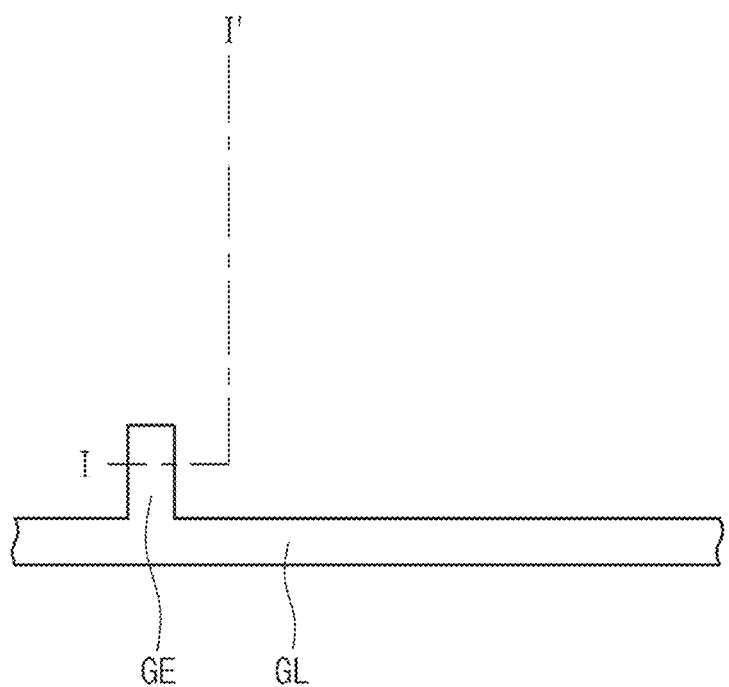

FIG. 6

| Cu Concentration | Comparative Example 1 | Comparative Example 2 | Comparative Example 3 | Comparative Example 4 | Comparative Example 5 |
|---|---|---|---|---|---|
| 0kppm | | | | | |
| 6kppm | | | | | |

| Cu Concentration | Comparative Example 6 | Comparative Example 7 | Comparative Example 8 | Comparative Example 9 | Comparative Example 10 |
|---|---|---|---|---|---|
| 0kppm | | | | | |
| 6kppm | | | | | |

| Cu Concentration | Comparative Example 11 | Comparative Example 12 | Comparative Example 13 | Comparative Example 14 | Comparative Example 15 |
|---|---|---|---|---|---|
| 0kppm | | | | | |
| 6kppm | | | | | |

| Cu Concentration | Comparative Example 16 | Comparative Example 17 | Comparative Example 18 | Comparative Example 19 | Comparative Example 20 |
|---|---|---|---|---|---|
| 0kppm | | | | | |
| 6kppm | | | | | |

ETCHANT COMPOSITION, AND METHOD FOR MANUFACTURING METAL PATTERN AND THIN FILM TRANSISTOR SUBSTRATE USING THE SAME

CROSS-REFERENCE TO RELATED APPLICATION

The present application claims priority to and the benefit of Korean Patent Application No. 10-2020-0188136, filed on Dec. 30, 2020, the entire content of which is hereby incorporated by reference.

BACKGROUND

The present disclosure herein relates to an etchant composition and a method for manufacturing a metal pattern and a thin film transistor substrate utilizing (e.g., using) the etchant composition, and more particularly, to an etchant composition provided for etching a multi-layered metal film and a method for manufacturing a metal pattern and a thin film transistor substrate utilizing (e.g., using) the etchant composition.

As high resolution, large area, and 3D display are features that are increasingly desired in the flat panel display industry, the need for a faster response speed is emerging. Particularly, in order to implement high resolution, it is desirable or useful to reduce the width of a metal pattern of a wiring utilized (e.g., used) in a circuit board of a display device. In this case, the height of the metal pattern is increased to adjust a resistance value, and accordingly, there is a problem in that the step coverage of stacked metal films becomes poor.

Therefore, when etching a metal wiring, an etchant composition is required or desired which is capable of controlling a taper etch profile and maintaining the properties thereof even when copper ions dissolved for a long time are accumulated.

The above information disclosed in this Background section is only for enhancement of understanding of the background and therefore the information discussed in this Background section does not necessarily constitute prior art.

SUMMARY

Aspects of the present disclosure are directed toward an etchant composition which can be used to pattern a metal wiring so that the metal wiring has an excellent taper inclination angle, and wherein the etchant composition is capable of maintaining the etch performance for a long period of time.

Aspects of the present disclosure are also directed toward a method for forming a metal wiring with reduced wiring defects such as disconnection.

Aspects of the present disclosure are also directed toward a method for manufacturing a thin film transistor substrate with reduced manufacturing time and cost and reduced wiring defects such as disconnection.

BRIEF DESCRIPTION OF THE FIGURES

The accompanying drawings are included to provide a further understanding of the present disclosure, and are incorporated in and constitute a part of this specification. The drawings illustrate aspects of some embodiments of the present disclosure and, together with the description, serve to explain principles of embodiments according to the present disclosure. In the drawings:

FIGS. 1A-1E are cross-sectional views sequentially illustrating tasks of a method for forming a metal pattern of an embodiment utilizing (e.g., using) an etchant composition according to an embodiment of the present disclosure;

FIGS. 4A-4C are plan views sequentially showing a manufacturing process of a thin film transistor substrate according to an embodiment of the present disclosure;

FIG. 6 is scanning electron microscope (SEM) images showing a side surface of a metal film etched with the etchants of Comparative Example 1 to Comparative Example 20 of the present disclosure;

DETAILED DESCRIPTION

Figure 1C:
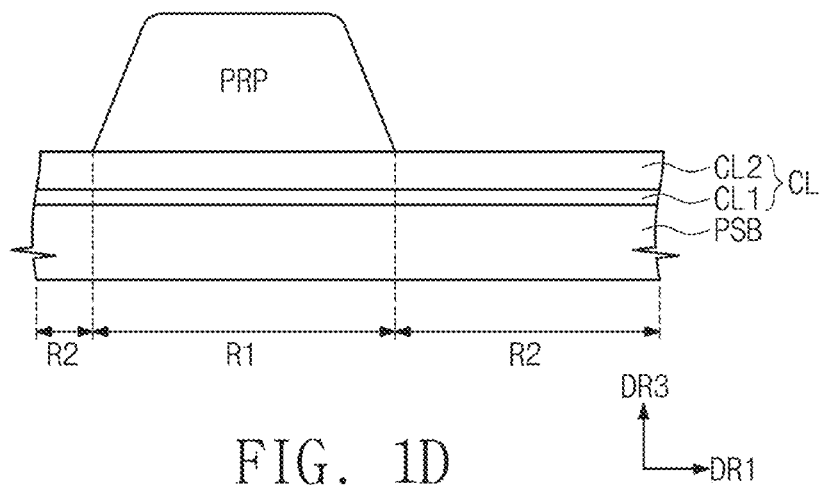

The present disclosure may be modified in many alternate forms, and thus specific embodiments will be illustrated in the drawings and described in more detail. It should be understood, however, that the disclosed embodiments are not intended to limit the present disclosure, but rather, the present disclosure is intended to cover all suitable modifications, equivalents, and alternatives falling within the spirit and scope of the present disclosure. As used herein, the use of the term "may," when describing embodiments of the present disclosure, refers to "one or more embodiments of the present disclosure."

Like reference numerals are used to refer to like elements in describing each drawing. In the accompanying drawings, the dimensions of elements may be exaggerated for clarity of the present disclosure. It will be understood that, although the terms "first", "second", etc. may be used herein to describe various elements, these elements should not be limited by these terms. These terms are only used to distinguish one element from another. For example, a first element may be referred to as a second element, and a second element may also be referred to as a first element in a similar manner without departing from the scope of rights of the present disclosure. The terms of a singular form may include plural forms unless the context clearly indicates otherwise.

In the present application, it should be understood that the terms "comprise", or "have" are intended to specify the presence of stated features, integers, steps, tasks, operations, elements, components, or combinations thereof in the disclosure, but do not preclude the presence or addition of one or more other features, integers, steps, tasks, operations, elements, components, or combinations thereof.

As used herein, expressions such as "at least one of", "one of", and "selected from", when preceding a list of elements, modify the entire list of elements and do not modify the individual elements of the list. For example, "at least one of a, b and c", "at least one of a, b or c", and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof. As used herein, the term "and/or" includes any and all combinations of one or more of the associated listed items.

As used herein, the term "substantially" and similar terms are used as terms of approximation and not as terms of degree, and are intended to account for the inherent deviations in measured or calculated values that would be recognized by those of ordinary skill in the art. Also, the terms "about," "approximately," and similar terms, when used herein in connection with a numerical value or a numerical range, are inclusive of the stated value and mean within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, or 5% of the stated value.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, applicant reserves the right to amend this specification, including the claims, to expressly recite any sub-range subsumed within the ranges expressly recited herein.

In the present disclosure, if a portion such as a layer, a film, a region, or a plate is referred to as being "on" or "above" another portion, it includes not only the case in which the portion is "directly on" the other portion, but also the case in which one or more intermediate portions is disposed therebetween. When a portion such as a layer, a film, a region, or a plate is referred to as being "under" or "below" another portion, it includes not only the case in which the portion is "directly under" the other portion, but also the case in which one or more intermediate portions is disposed therebetween. In addition, in the present disclosure, being disposed "on" not only includes the case of being disposed above, but also includes, for example, the case of being disposed below.

Hereinafter, an etchant composition according to an embodiment of the present disclosure will be described.

The etchant composition according to an embodiment of the present disclosure may be utilized (e.g., used) for etching a metal film to form a metal pattern. The etchant composition according to an embodiment of the present disclosure may be utilized (e.g., used) for etching a metal film containing copper (Cu) and/or titanium (Ti). For example, the etchant composition of an embodiment may be utilized (e.g., used) for etching a metal film of a multi-layered film structure in which a titanium metal film containing titanium and a copper metal film containing copper are laminated, thereby forming a metal pattern. For example, a metal film may be a double-layered film in which a titanium metal film and a copper metal film are sequentially laminated.

The etchant composition of an embodiment includes (e.g., is) persulfate, phosphoric acid and/or phosphate, a carbonyl ring compound, a 3-nitrogen ring compound, a 4-nitrogen ring compound, a fluorine compound, hydrogen sulfate, a zwitterionic compound, and/or water.

In the etchant composition of an embodiment, the persulfate is a main oxidization agent, and may be an etching agent for etching a metal film containing copper. However, the embodiment is not limited thereto. For example, the persulfate may etch a metal film containing titanium.

The persulfate may be included in an amount of about 5 wt % to about 20 wt % based on the total weight of the etchant composition. For example, the persulfate may be included in an amount of about 10 wt % to about 20 wt % based on the total weight of the etchant composition. For example, the persulfate may be included in an amount of about 10 wt % to about 18 wt % based on the total weight of the etchant composition.

When the content of the persulfate is greater than about 20 wt %, the etch speed of a metal film utilizing (e.g., using) the etchant composition of an embodiment may be too fast to control the degree of etching, and accordingly, the metal film containing copper may be overetched. In addition, when the content of the persulfate is less than about 5 wt %, the etch rate may decrease, so that etching may not be achieved sufficiently.

The persulfate may be potassium persulfate ($K_2S_2O_8$), sodium persulfate ($Na_2S_2O_8$), ammonium persulfate (($NH_4$)$_2S_2O_8$), and/or the like. The etchant composition of an embodiment may include, as the persulfate, at least one of potassium persulfate, sodium persulfate, or ammonium persulfate. For example, the etchant composition of an embodiment may include, as the persulfate, any one selected from potassium persulfate, sodium persulfate, and ammonium persulfate, or a mixture of two or more thereof.

The etchant composition of an embodiment includes phosphoric acid ($H_3PO_4$) and/or phosphate. The phosphoric acid and/or phosphate may be contained in the etchant composition to control the Galvanic corrosion of a copper film and/or a titanium film. That is, the phosphoric acid and/or phosphate is a Galvanic regulator between copper and titanium, and may serve to reduce skew due to overetching and to lower a taper angle by decreasing the rate at which electrons are transferred from a titanium-containing metal film to a copper-containing metal film. In addition, the phosphoric acid and/or phosphate may serve to maintain a taper angle even when copper ions increase.

The etchant composition of an embodiment may include phosphoric acid and/or phosphate in an amount of about 0.1 wt % to about 5 wt % based on the total weight of the etchant composition. For example, the etchant composition of an embodiment may include phosphoric acid and/or phosphate in an amount of about 0.1 wt % to about 2 wt % based on the total weight of the etchant composition.

When the content of phosphoric acid and/or phosphate is greater than about 5 wt % based on the total weight of the etchant composition, an initial taper angle of a copper film and a titanium film is too low, so that there may be a problem in that the volume of a wiring is reduced and the charge mobility is degraded. In addition, when the content of phosphoric acid and/or phosphate is less than about 0.1 wt %, it may not be possible to decrease an etch speed of a lower titanium film, so that a taper angle is increased, which may cause defects due to the step coverage difference. For example, the phosphate may include (e.g., be) at least one selected from monoammonium phosphate ($NH_4H_2PO_4$), monosodium phosphate ($NaH_2PO_4$), and monopotassium phosphate ($KH_2PO_4$).

The etchant composition of an embodiment includes a carbonyl ring compound. In the present specification, the carbonyl ring compound refers to a compound in which a carbon atom of a carbonyl group is included as a ring-forming carbon of a ring compound. In an embodiment, the carbonyl ring compound may include at least two carbonyl groups forming a ring. For example, the carbonyl ring compound may be a carbonyl ring-type (e.g., ring-kind) compound in which carbon atoms of two carbonyl groups become ring-forming carbons.

The carbonyl ring compound included in the etchant composition of an embodiment may serve as a sulfate radical scavenger for removing sulfate radicals generated during an etching process of a copper metal film. The persulfate included in the etchant composition of an embodiment generates sulfate radicals when etching of the copper metal film, and the generated sulfate radicals may attack and decompose a 4-nitrogen ring compound. For example, the generated sulfate radicals may interact with the 4-nitrogen ring compound to decompose the 4-nitrogen ring compound. In addition, a portion of the decomposed 4-nitrogen ring compound may be adsorbed to the copper metal film, and may degrade the etch performance of the etchant composition. Therefore, when the etchant composition of an embodiment includes a carbonyl ring compound, the carbonyl ring compound suppresses the decomposition of a 4-nitrogen ring compound to improve the etch performance of the etchant composition.

The carbonyl ring compound with two or more carbonyl groups may be included in an amount of about 0.01 wt % to about 2.0 wt % based on the total weight of the etchant composition. For example, the etchant composition of an embodiment may include the carbonyl ring compound in an amount of about 0.01 wt % to about 1.0 wt % based on the total weight of the etchant composition.

When the content of the carbonyl ring compound is greater than about 1 wt %, the carbonyl ring compound may be adsorbed to a metal layer, so that there may be a problem in that the etch performance of the etchant composition is degraded. In addition, when the content of the carbonyl ring compound is less than about 0.01 wt %, the carbonyl ring compound cannot sufficiently function as a radical scavenger to suppress the decomposition of the 4-nitrogen ring compound in the etchant composition, and accordingly, there may be a problem that the etch performance is degraded.

The carbonyl ring compound may be thiazolidinedione, hydantoin, or succinimide. The etchant composition of an embodiment may include, as the carbonyl ring compound, at least one of thiazolidinedione, hydantoin, or succinimide. For example, the etchant composition of an embodiment may include, as the carbonyl ring compound, any one of thiazolidinedione, hydantoin, and succinimide, or a mixture of two or more thereof.

The etchant composition of an embodiment includes a 3-nitrogen ring compound. In the present specification, the 3-nitrogen ring compound refers to a compound in which 3 of atoms forming a ring are nitrogen atoms.

In an embodiment, the 3-nitrogen ring compound may include a thiol group (—SH). The 3-nitrogen ring compound may be a substituted triazole compound. For example, the 3-nitrogen ring compound may be a substituted triazole compound including a group (e.g., a thiol group) as a substituent. For example, the 3-nitrogen ring compound comprises at least one of 3-Mercapto-4-methyl-4H-1,2,4-triazole, 3-Amino-1,2,4-triazole-5-thiol, and 1H-1,2,4-triazole-3-thiol.

The 3-nitrogen ring compound included in the etchant composition of an embodiment may serve as an oxygen radical scavenger for removing oxygen radicals generated during an etching process of a copper metal film. The persulfate included in the etchant of an embodiment generates oxygen radicals in addition to sulfate radicals during a process of etching the copper metal film, and the generated oxygen radicals may attack and decompose the carbonyl ring compound. For example, the generated oxygen radicals may interact with the carbonyl ring compound to decompose the carbonyl ring compound. In addition, when the carbonyl ring compound is decomposed, the carbonyl ring compound may not serve as a sulfate radical scavenger for suppressing the decomposition of the 4-nitrogen ring compound, so that the etch performance of the etchant composition may decrease. That is, the etchant composition of an embodiment includes the 3-nitrogen ring compound with a thiol group, and thus, may prevent or reduce the decomposition of the carbonyl ring compound and the 4-nitrogen ring compound to improve etch performance.

The 3-nitrogen ring compound may be included in an amount of about 0.01 wt % to about 1 wt % based on the total weight of the etchant composition. For example, the etchant composition of an embodiment may include the 3-nitrogen ring compound in an amount of about 0.01 wt % to about 0.5 wt % based on the total weight of the etchant composition. For example, the etchant composition of an embodiment may include the 3-nitrogen ring compound in an amount of about 0.02 wt % to about 0.4 wt % based on the total weight of the etchant composition.

When the content of the 3-nitrogen ring compound is greater than about 1 wt %, the 3-nitrogen ring compound in excess may be adsorbed to a metal film to be etched, and may degrade the etch performance of the etchant composition. In addition, when the content of the 3-nitrogen ring compound is less than about 0.01 wt %, oxygen radicals generated during an etching process may not be removed (e.g., sufficiently removed), thereby allowing the decomposition of the carbonyl ring compound and the 4-nitrogen ring compound, and accordingly, the etch quality of the etchant composition may be degraded.

Meanwhile, in the etchant composition of an embodiment, the carbonyl ring compound and the 3-nitrogen ring compound may be included in a weight ratio of about 1:0.2 to about 1:2. In some embodiments, the weight ratio of the carbonyl ring compound to the 3-nitrogen ring compound in the etchant composition may be about 1:0.2 to about 1:2. In the etchant composition of an embodiment, the carbonyl ring compound and the 3-nitrogen ring compound may be included in a weight ratio of about 1:0.2 to about 1:2, so that the oxygen radicals generated during the etching process are efficiently removed to prevent or reduce the degradation in etch performance.

The etchant composition of an embodiment includes a 4-nitrogen ring compound. The 4-nitrogen ring compound prevents or reduces the corrosion of copper to stably maintain the surface profile of copper to be etched. In the present specification, the 4-nitrogen ring compound refers to a compound in which 4 of atoms forming a ring are nitrogen atoms.

The 4-nitrogen ring compound may be included in an amount of about 0.1 wt % to about 2 wt % based on the total weight of the etchant composition. For example, the etchant composition of an embodiment may include the 4-nitrogen ring compound in an amount of about 0.1 wt % to about 1 wt % based on the total weight of the etchant composition. For example, the etchant composition of an embodiment may include the 4-nitrogen ring compound in an amount of about 0.2 wt % to about 0.7 wt % based on the total weight of the etchant composition.

When the content of the 4-nitrogen ring compound is greater than about 2 wt %, the etch speed become slow due to the influence of the 4-nitrogen ring compound in excess, so that the process capability of an etching process utilizing (e.g., using) the etchant composition of an embodiment may be degraded. In addition, when the content of the 4-nitrogen ring compound is less than about 0.1 wt %, the etch speed of a metal film containing copper is excessively increased, so that it may be difficult to control the degree of etching of the metal film.

The 4-nitrogen ring compound may be a substituted or unsubstituted tetrazole compound. For example, the 4-nitrogen ring compound may be aminotetrazole, methyltetrazole, or mercaptomethyltetrazole. The etchant composition of an embodiment may include at least one of aminotetrazole, methyltetrazole, or mercaptomethyltetrazole. For example, the etchant composition of an embodiment may include, as the 4-nitrogen ring compound, any one of aminotetrazole, methyltetrazole, and mercaptomethyltetrazole, or a mixture of two or more thereof.

In the etchant composition of an embodiment, the weight ratio of the 4-nitrogen ring compound and the carbonyl ring compound may be about 1:0.1 to about 1:2. In some embodiments, the weight ratio of the 4-nitrogen ring compound to the carbonyl ring compound in the etchant composition is about 1:0.1 to about 1:2. When the weight ratio of the 4-nitrogen ring compound and the carbonyl ring compound is less than about 1:0.1, the carbonyl ring compound may not serve as a radical scavenger, so that the etch performance is degraded, and when the weight ratio of the 4-nitrogen ring compound and the carbonyl ring compound is greater than about 1:2, the carbonyl ring compound is more prone to be adsorbed to a metal film, so that there may be a problem in that the etch performance is degraded.

The etchant composition of an embodiment includes a fluorine compound. The fluorine compound refers to a fluoride containing a fluorine (F) atom. The fluorine compound may be an etching agent for etching a metal film containing titanium. However, the embodiment is not limited thereto. For example, the fluorine compound may etch a metal film containing copper.

The fluorine compound may be included in an amount of about 0.1 wt % to about 0.9 wt % based on the total weight of the etchant composition. For example, the etchant composition of an embodiment may include the fluorine compound in an amount of about 0.2 wt % to about 0.7 wt % based on the total weight of the etchant composition.

When the content of the fluorine compound is greater than about 0.9 wt %, the metal film containing titanium may be overetched, and accordingly, there may be an undercut on a lower portion of the metal film containing titanium, and there may be a problem in that an insulation film, a substrate, and/or the like on the lower portion of the metal layer is additionally etched. In addition, when the content of the fluorine compound is less than about 0.1 wt %, the etching of the metal film containing titanium may not be effectively and/or suitably achieved.

The fluorine compound may be hydrofluoric acid (HF), ammonium fluoride ($NH_4F$), potassium fluoride (KF), sodium fluoride (NaF), ammonium bifluoride ($F_2H_5N$) ($NH_4HF_2$), potassium bifluoride ($KHF_2$), or sodium bifluoride ($NaHF_2$). The etchant composition of an embodiment may include at least one of hydrofluoric acid (HF), ammonium fluoride ($NH_4F$), potassium fluoride (KF), sodium fluoride (NaF), ammonium bifluoride ($F_2H_5N$) ($NH_4HF_2$), potassium bifluoride ($KHF_2$), or sodium bifluoride ($NaHF_2$). For example, the etchant composition of an embodiment may include, as the fluorine compound, any one of hydrofluoric acid (HF), ammonium fluoride ($NH_4F$), potassium fluoride (KF), sodium fluoride (NaF), ammonium bifluoride ($F_2H_5N$) ($NH_4HF_2$), potassium bifluoride ($KHF_2$), and sodium bifluoride ($NaHF_2$), or a mixture of two or more thereof.

The etchant composition of an embodiment includes hydrogen sulfate. The hydrogen sulfate may be utilized (e.g., used) as a stabilizer of the etchant composition of an embodiment. In an embodiment, the hydrogen sulfate may be utilized (e.g., used) as a stabilizer of persulfate. For example, the hydrogen sulfate may serve to prevent or reduce the decrease in etch performance due to the decomposition of persulfate by a zwitterionic compound. That is, the hydrogen sulfate may serve to decrease the decomposition speed of persulfate so as to maintain a constant etch speed of a metal film containing copper during an etching process utilizing (e.g., using) the etchant composition of an embodiment.

In the etchant composition of an embodiment, the hydrogen sulfate may be included in an amount of about 0.1 wt % to about 0.5 wt % based on the total weight of the etchant composition. For example, the etchant composition of an embodiment may include the hydrogen sulfate in an amount of about 0.2 wt % to about 0.5 wt % based on the total weight of the etchant composition.

When the content of the hydrogen sulfate is greater than about 0.5 wt %, the etch speed may not be suitably controlled, thereby allowing the etch speed of the metal film containing copper to excessively increase, so that erosion defects may occur. In addition, when the content of the hydrogen sulfate is less than about 0.1 wt %, the effect of suppressing the decomposition of persulfate is not suitably exhibited, so that the stability of the etchant composition of an embodiment may be degraded.

The hydrogen sulfate may be ammonium hydrogen sulfate ($NH_4HSO_4$), lithium hydrogen sulfate ($LiHSO_4$), potassium hydrogen sulfate ($KHSO_4$), or sodium hydrogen sulfate ($NaHSO_4$). The etchant composition of an embodiment may include, as the hydrogen sulfate, any one of ammonium hydrogen sulfate ($NH_4HSO_4$), lithium hydrogen sulfate ($LiHSO_4$), potassium hydrogen sulfate ($KHSO_4$), or sodium hydrogen sulfate ($NaHSO_4$). For example, the etchant composition of an embodiment may include, as the hydrogen sulfate, at least one of ammonium hydrogen sulfate ($NH_4HSO_4$), lithium hydrogen sulfate ($LiHSO_4$), potassium hydrogen sulfate ($KHSO_4$), or sodium hydrogen sulfate ($NaHSO_4$), or a mixture of two or more thereof.

The etchant composition of an embodiment includes a zwitterionic compound. The zwitterionic compound may be utilized (e.g., used) as a strong oxidization agent. The zwitterionic compound increases the etch rate of a metal film containing copper and/or titanium, and may allow copper to be in a stable state of divalent cations during etching.

In the etchant composition of an embodiment, the zwitterionic compound may be included in an amount of about 1 wt % to about 3 wt % based on the total weight of the etchant composition. When the content of the zwitterionic compound is greater than about 3 wt %, the decomposition of persulfate is promoted, so that the stability of the etchant composition may be degraded. In addition, when the content of the zwitterionic compound is less than about 1 wt %, an etch rate may gradually decrease in accordance with the progress of an etching process, so that the etch performance may be degraded.

In the etchant composition of an embodiment, the zwitterionic compound may include a sulfo group or a carboxyl group as a functional group. For example, the zwitterionic compound may include any one of sulfamic acid, aminomethanesulfonic acid, taurine, and homotaurine, or a mixture of two or more thereof. Meanwhile, when the zwitterionic compound includes a carboxyl group as a functional group, a copper chelating effect may occur due to an amino group and the carboxyl group of the zwitterionic compound, and as a result, the zwitterionic compound may be adsorbed on the surface of copper, thereby rapidly decreasing a copper etch rate, so that the productivity of a product is degraded due to an increase of the process tact time.

The zwitterionic compound of an embodiment should respectively satisfy the content ratio with hydrogen sulfate and with persulfate in order to exhibit desired or optimal performance.

In the etchant composition of an embodiment, the weight ratio of the hydrogen sulfate and the zwitterionic compound may be about 1:2 to about 1:25. In some embodiments, the weight ratio of the hydrogen sulfate to the zwitterionic compound is about 1:2 to about 1:25. When the weight ratio of the hydrogen sulfate and the zwitterionic compound is less than about 1:2, there is a possibility in that a taper angle may increase due to an increase in the hydrogen sulfate, and when the weight ratio of the hydrogen sulfate and the zwitterionic compound is greater than 1:25, the effect of decreasing the decomposition speed of persulfate by the hydrogen sulfate is insignificant, so that storage stability properties over time may be poor.

In the etchant composition of an embodiment, the weight ratio of the zwitterionic compound and the persulfate (e.g., the weight ratio of the zwitterionic compound to the persulfate) may be about 1:1.6 to about 1:20, for example 1:1.67 to 1:20. When the weight ratio of the zwitterionic compound and the persulfate is less than 1:1.6, storage stability properties due to the decomposition of the persulfate over time becomes severe, so that the etch performance is degraded, and when the weight ratio of the zwitterionic compound and the persulfate is greater than 1:20, there is a problem in that an initial taper angle increases.

Meanwhile, the etchant composition of an embodiment includes water. The water may be included in the etchant composition in an amount that makes the total weight of the above-described compounds constituting the etchant composition and the water becomes about 100 wt %. For example, the water accounts for the remainder other than the sum of the wt % of the components other than water in the entire etchant composition. As the water utilized (e.g., used) in the etchant composition of an embodiment, semiconductor grade water or ultra-pure water may be utilized (e.g., used).

The etchant composition of an embodiment is utilized (e.g., used) in a process of manufacturing an electronic device, and for example, may be utilized (e.g., used) in a process of etching a laminated metal film to form a metal pattern in the process of manufacturing of an electronic device. For example, the etchant composition according to an embodiment may be utilized (e.g., used) in a manufacturing process of a thin film transistor substrate in a manufacturing process of a display device, and for example, may be utilized (e.g., used) for etching a double-layered film composed of titanium and copper to form a gate electrode.

The etchant composition of an embodiment is a non-hydrogen peroxide ($H_2O_2$) etchant composition including persulfate as a main component. A metal pattern manufactured by an etching process utilizing (e.g., using) the etchant composition of an embodiment exhibits good etching properties such as having a small critical dimension (CD) skew and a low taper angle. In addition, the etchant composition of an embodiment may be utilized (e.g., used) for batch etching of a multi-layered metal film in which a titanium metal film and a copper metal film are laminated, and may minimize or reduce the generation of precipitates during an etching process, thereby increasing the number of reuses of the etchant composition.

Hereinafter, a method for manufacturing a metal pattern and a method for manufacturing a thin film transistor substrate according to an embodiment of the present disclosure will be described.

FIG. 1A to FIG. 1E are cross-sectional views sequentially illustrating a method for forming a metal pattern utilizing (e.g., using) the etchant composition of an embodiment described above. FIG. 1A to FIG. 1E schematically show a cross-section on a plane parallel to a plane defined by a third direction axis DR3, which is a thickness direction, and a first direction axis DR1 normal (e.g., perpendicular) thereto.

The method for forming a metal pattern of an embodiment may include the tasks of: forming a metal film; forming a photoresist pattern on the metal film; providing an etchant composition on the metal film on which the photoresist pattern is formed; and removing the photoresist pattern.

In the method for manufacturing a metal pattern of an embodiment, FIG. 1A to FIG. 1C may show the task of forming a photoresist pattern on the metal film. The task of forming a photoresist pattern on the metal film may include the tasks of: forming a metal film containing titanium and copper on a substrate; and then forming a photoresist pattern on the metal film.

FIG. 1A may show the task of forming a metal film CL containing titanium and copper. The task of forming the metal film CL may include the tasks of: forming a first metal film CL1 on a substrate PSB; and forming a second metal film CL2 on the first metal film CL1. The first metal film CL1 may be a metal film containing (e.g., being) titanium, and the second metal film CL2 may be a metal film containing (e.g., being) copper. Meanwhile, in FIG. 1A, the metal film CL is illustrated as a double-layered film in which the first metal film CL1 and the second metal film CL2 are sequentially laminated, but the embodiment is not limited thereto. The metal film CL may be a single film made of an alloy containing (e.g., being) titanium and copper, or a multi-layered film of three or more films in which a titanium metal film and a copper metal film are alternately laminated.

Meanwhile, the substrate PSB may be an insulation substrate. In some embodiments, the substrate PSB may be a thin film transistor substrate in a manufacturing process. For example, the substrate PSB may be an unfinished thin film transistor substrate, and may be a thin film transistor substrate in an intermediate task in which some circuit layers are formed on a base substrate. For example, the substrate PSB may represent a portion of a thin film transistor substrate SUB1 (see FIG. 3) in a display device of an embodiment to be described later, and for example, the substrate PSB may represent a first base substrate BS1 (see FIG. 3).

As illustrated in FIG. 1A, the metal film CL is formed on the substrate PSB, and then, as illustrated in FIG. 1B, a photoresist film PR is provided on the front surface (e.g., top surface) of the metal film CL formed on the substrate PSB, following by exposing the photoresist film PR through a mask MSK. For example, the photoresist film PR may be provided on a surface of the metal film CL facing oppositely away from (opposite to) a surface of the metal film CL that the substrate PSB is on.

The mask MSK may be composed of a first portion M1 which blocks all (e.g., substantially all) of irradiated light, and a second portion M2 which transmits only a portion of light and blocks another portion thereof. The substrate PSB and the metal film CL may be divided into a first region R1 and a second region R2 respectively corresponding to (e.g., overlapping in a plan view) the first portion M1 and the second portion M2.

Thereafter, when the photoresist film PR exposed through the mask MSK is developed, as illustrated in FIG. 1C, a photoresist pattern PRP with a set or predetermined thickness remains in the first region R1 blocked by the mask MSK, and thus, not provided with light, and the photoresist film PR is completely removed from the second region R2 provided with light transmitted the second portion M2 of the mask MSK, thereby exposing the surface of the metal film CL. Meanwhile, in the description with respect to FIG. 1B and FIG. 1C, a case in which a positive photoresist is utilized (e.g., used) to remove a photoresist film in an exposed portion is described for purposes of illustration. However, the embodiments are not limited thereto. In an embodiment, a negative photoresist may be utilized (e.g., used) to remove a photoresist film in a non-exposed portion.

Figure 1D:
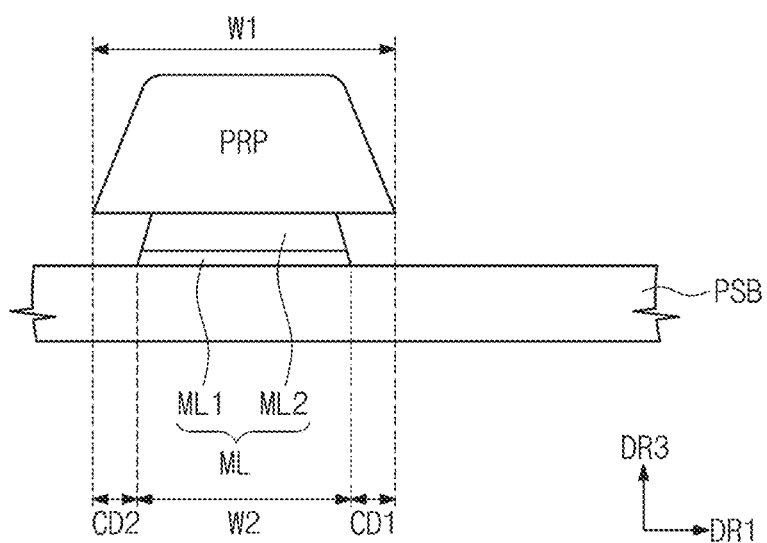

Next, utilizing (e.g., using) the photoresist pattern PRP, the first metal film CL1 and the second metal film CL2 may be patterned. The photoresist pattern PRP may be utilized (e.g., used) as a mask layer for patterning the metal film CL. For example, as illustrate in FIG. 1C, an etchant composition may be provided on the metal film CL on which the photoresist pattern PRP is formed, and the metal film CL on which the photoresist pattern PRP is not formed may be etched by the provided etchant composition to form a metal pattern ML as illustrated in FIG. 1D. The metal pattern ML may include (e.g., be) a first metal pattern ML1 and a second metal pattern ML2. In an embodiment, the first metal pattern ML1 may be a titanium metal layer, and the second metal pattern ML2 may be a copper metal layer.

The etchant composition of an embodiment may perform batch etching of the first metal film CL1 and the second metal film CL2 to form the metal pattern ML. The etchant composition provided in the method for manufacturing a metal pattern of an embodiment is the etchant composition according to an embodiment of the present disclosure described above.

Figure 1E:
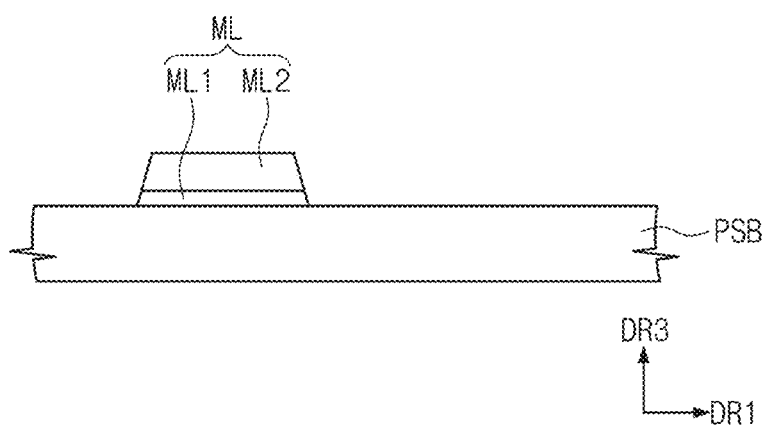

Referring to FIG. 1D and FIG. 1E, the photoresist pattern PRP and the metal pattern ML may have a trapezoidal shape on a cross-section defined by the first direction axis DR1 and the third direction axis DR3. However, the embodiment is not limited thereto.

Meanwhile, on the cross-section, a maximum width W2 of the metal pattern ML may be less than a maximum width W1 of the photoresist pattern PRP. Meanwhile, in an etching process utilizing (e.g., using) the photoresist pattern PRP, a difference W1−W2 between the maximum width W1 of the photoresist pattern PRP and the maximum width W2 of the metal pattern ML is defined as the critical dimension (CD) skew, and in FIG. 1D, "CD1," or "CD2" each correspond to one-side CD skew.

After the metal pattern ML is formed utilizing (e.g., using) the photoresist pattern PRP, the photoresist pattern PRP may be removed. FIG. 1E shows a final metal pattern ML from which the photoresist pattern PRP is removed. The metal pattern ML may be a multi-layered metal pattern in which a titanium metal pattern and a copper metal pattern are laminated.

In the method for manufacturing a metal pattern according to an embodiment of the present disclosure, a metal pattern made of a first metal and a second metal, for example, a double-layered film metal pattern of titanium/copper may be manufactured. In the description with respect to FIG. 1A to FIG. 1E, a method for forming a metal pattern formed of multiple layers is disclosed. However, the embodiment is not limited thereto. A metal pattern formed of a single layer containing (e.g., being) copper may substantially be manufactured by the same method.

Figure 2:
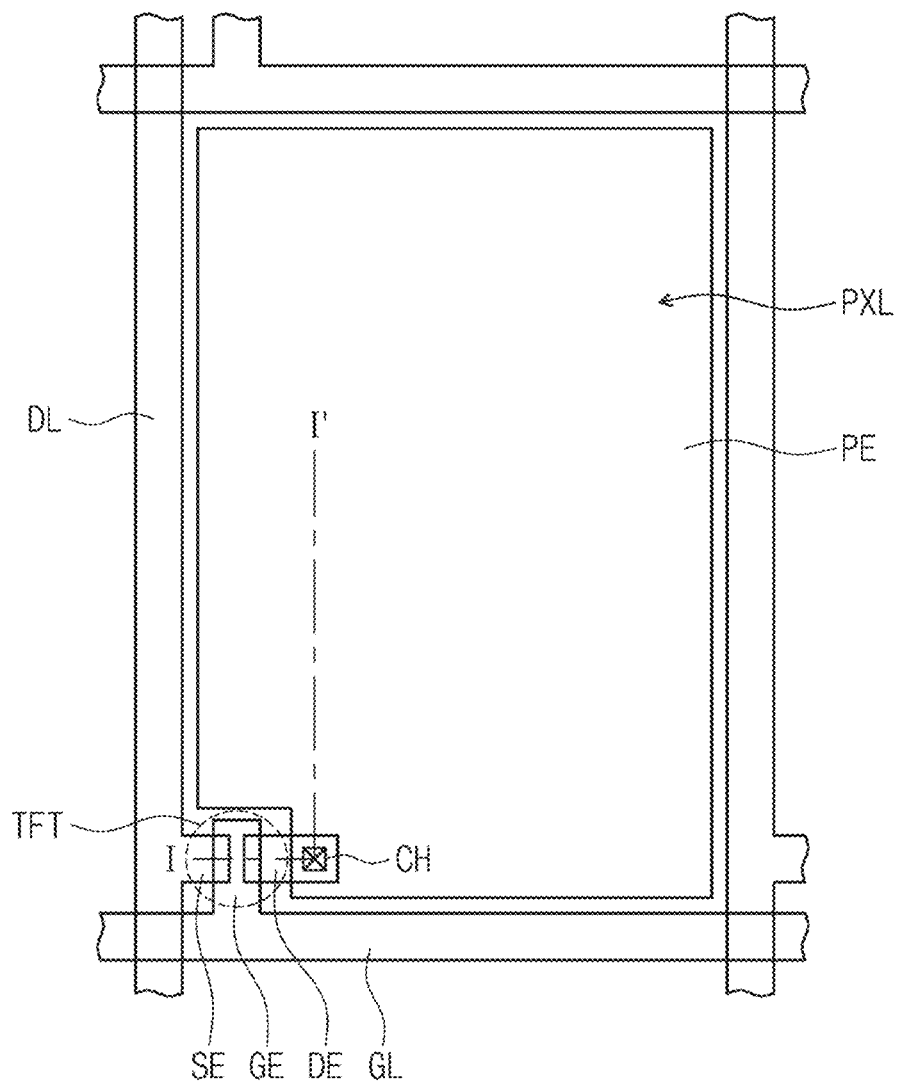
FIG. 2 is a plan view illustrating a pixel structure of a display device including a thin film transistor substrate according to an embodiment of the present disclosure.
Figure 3:
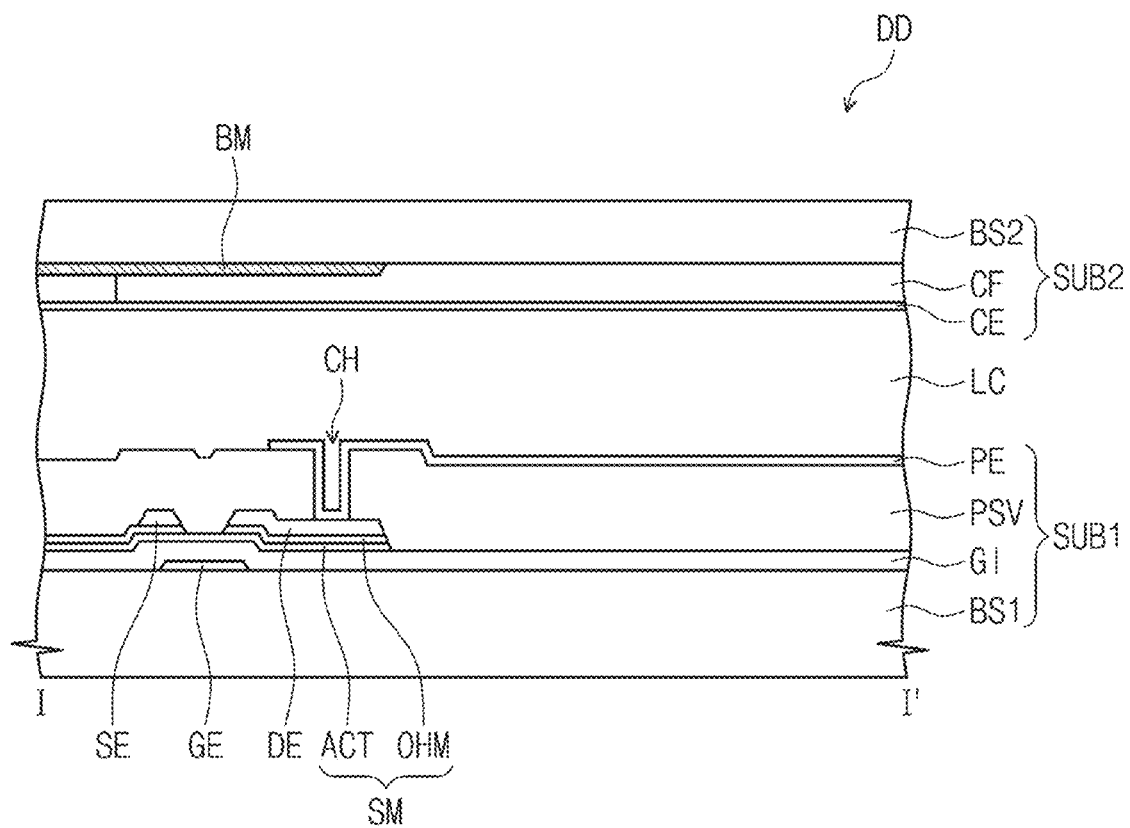
FIG. 3 is a cross-sectional view taken along I-I' of FIG. 2.

FIG. 2 is a plan view illustrating a pixel structure of a display device including a thin film transistor substrate manufactured by a method for manufacturing a thin film transistor substrate of an embodiment. FIG. 3 is a cross-sectional view taken along I-I' of FIG. 2. Hereinafter, referring to FIG. 2 and FIG. 3, a thin film transistor substrate manufactured by a method for manufacturing a thin film transistor substrate of an embodiment, and a display device provided with the thin film transistor substrate will be described.

A thin film transistor substrate manufactured by a method for manufacturing a thin film transistor substrate of an embodiment may be applied as a substrate including an electronic circuit for driving a display device. The display device is not limited to a particular type or kind, and may include various suitable display devices, for example, a liquid crystal display device, an organic light emitting display device, an electrophoretic display device, an electrowetting display device, a microelectromechanical system (MEMS) display device, and/or the like.

Meanwhile, in FIG. 2 and FIG. 3 and the like, a liquid crystal display device among display devices is illustrated as an example, but the embodiment is not limited thereto. For example, the display device may be an organic light emitting display device. Meanwhile, in an embodiment of a display device having a plurality of pixels, each pixel may have the same structure, so that one pixel is illustrated in FIG. 2 and FIG. 3 for convenience of explanation. Meanwhile, in FIG. 2, one pixel PXL coupled (e.g., connected) to one gate line among gate lines GL and one data line among data lines DL is illustrated, but the embodiment is not limited thereto. For example, one gate line and one data line may be coupled (e.g., connected) to a plurality of pixels, and a plurality gate lines and a plurality of data lines may be coupled (e.g., connected) to one pixel.

Referring to FIG. 2 and FIG. 3, a display device DD may include a thin film transistor substrate SUB1 provided with the pixel PXL, an opposite substrate SUB2 facing (e.g., overlapping) the thin film transistor substrate SUB1, and a liquid crystal layer LC disposed between the thin film transistor substrate SUB1 and the opposite substrate SUB2.

When referring to FIG. 2 and FIG. 3, the gate line GL is formed extended in a second direction axis DR2. The gate line GL may be formed on a first base substrate BS1. The data line DL may be provided extended in a first direction axis DR1 which crosses or intersects the gate line GL.

Each of the pixels PXL includes a thin film transistor TFT and a pixel electrode PE coupled (e.g., connected) to the thin film transistor TFT. The thin film transistor TFT includes a gate electrode GE, a gate insulation film GI, a semiconductor pattern SM, a source electrode SE, and a drain electrode DE.

The gate electrode GE may protrude from the gate line GL or may be provided in some regions of the gate line GL. The gate electrode GE may be made of a metal. The gate electrode GE may be formed of a single film or a multi-layered film utilizing (e.g., using) a metal.

The semiconductor pattern SM is provided on the gate insulation film GI. The semiconductor pattern SM is provided on the gate electrode GE with the gate insulation film GI interposed therebetween. Some regions of the semiconductor pattern SM overlap the gate electrode GE. The semiconductor pattern SM includes an active pattern ACT provided on the gate insulation film GI and an ohmic contact layer OHM formed on the active pattern ACT. The active pattern ACT may be made of an amorphous silicon thin film, and the ohmic contact layer OHM may be made of an n+ amorphous silicon thin film. The ohmic contact layer OHM ohmic contacts the active pattern ACT with the source electrode SE and the drain electrode DE, respectively.

The source electrode SE is provided by being branched from the data lines DL. The source electrode SE is formed on the ohmic contact layer OHM, and some regions of the source electrode SE overlap the gate electrode GE. The data line DL may be disposed in a region of the gate insulation film GI on which the semiconductor pattern SM is not disposed.

The drain electrode DE is provided spaced apart from the source electrode SE with the semiconductor pattern SM interposed therebetween (e.g., interposed therebetween in a plan view). The drain electrode DE is formed on the ohmic contact layer OHM, and some regions of the drain electrode DE are provided overlapping the gate electrode GE.

In an embodiment, the gate line GL and the gate electrode GE may be formed of a multi-layered film including (e.g., being) a metal film containing (e.g., being) copper and a metal film containing (e.g., being) titanium. For example, the gate line GL and the gate electrode GE may be a double-layered film metal pattern of a copper metal pattern and a titanium metal pattern formed by etching a titanium metal film and a copper metal film sequentially laminated. However, the embodiment is not limited thereto. For example, the gate line GL and the gate electrode GE may be a metal pattern of a single layer made of an alloy of titanium and copper, or a multi-layered film metal pattern in which a titanium metal pattern and a copper metal pattern are laminated in multiple layers of three or more layers.

In an embodiment, the gate line GL and the gate electrode GE may be formed by being patterned by an etching process utilizing (e.g., using) the above-described etchant composition of an embodiment. In the case of a method for manufacturing a thin film transistor substrate of an embodiment utilizing (e.g., using) the etchant composition of an embodiment, when a double-layered film of a titanium metal film and a copper metal film is patterned, a metal pattern may be allowed to have a small CD skew value and a low taper angle so as to allow the gate line GL and the gate electrode GE to have a good taper profile.

In addition, in a method for manufacturing a thin film transistor substrate of an embodiment, the etchant composition of an embodiment may allow the gate electrode GE to have a low taper angle so as to allow the gate insulation film GI, the semiconductor pattern SM, and the source electrode SE and the drain electrode DE, which are later formed by being laminated, to have good step coverage.

The gate electrode GE formed by being etched with the etchant composition of an embodiment may have a taper angle of about 30 degrees to about 40 degrees. In some embodiments, the taper angle of the gate electrode GE may be about 40 degrees to about 45 degrees.

In an embodiment, an insulation layer PSV of the thin film transistor substrate SUB1 covers the source electrode SE, the drain electrode DE, a channel part, and the gate insulation film GI, and has a contact hole CH for exposing a portion of the drain electrode DE. The insulation layer PSV may include, for example, silicon nitride and/or silicon oxide.

The pixel electrode PE is coupled (e.g., connected) to the drain electrode DE through the contact hole CH formed in the insulation layer PSV. The pixel electrode PE may be formed of a transparent conductive material. For example, the pixel electrode PE is formed of a transparent conductive oxide. The transparent conductive oxide may be indium tin oxide (ITO), indium zinc oxide (IZO), indium tin zinc oxide (ITZO), and/or the like.

In some embodiments, the thin film transistor substrate SUB1 may include the thin film transistor TFT, the insulation layer PSV, and the pixel electrode PE formed on the first base substrate BS1. Meanwhile, according to some embodiments, the thin film transistor substrate SUB1 may further include an alignment layer formed on the pixel electrode PE.

The opposite substrate SUB2 is disposed opposing the thin film transistor substrate SUB1, and may include a second base substrate BS2, a color filter CF disposed on a lower portion of the second base substrate BS2, a light blocking part BM disposed between color filters CF implementing different colors and blocking light, and a common electrode CE forming an electric field with the pixel electrode PE. Meanwhile, according to some embodiments, an alignment layer may be further disposed on a lower portion of the common electrode CE.

Figure 4B:
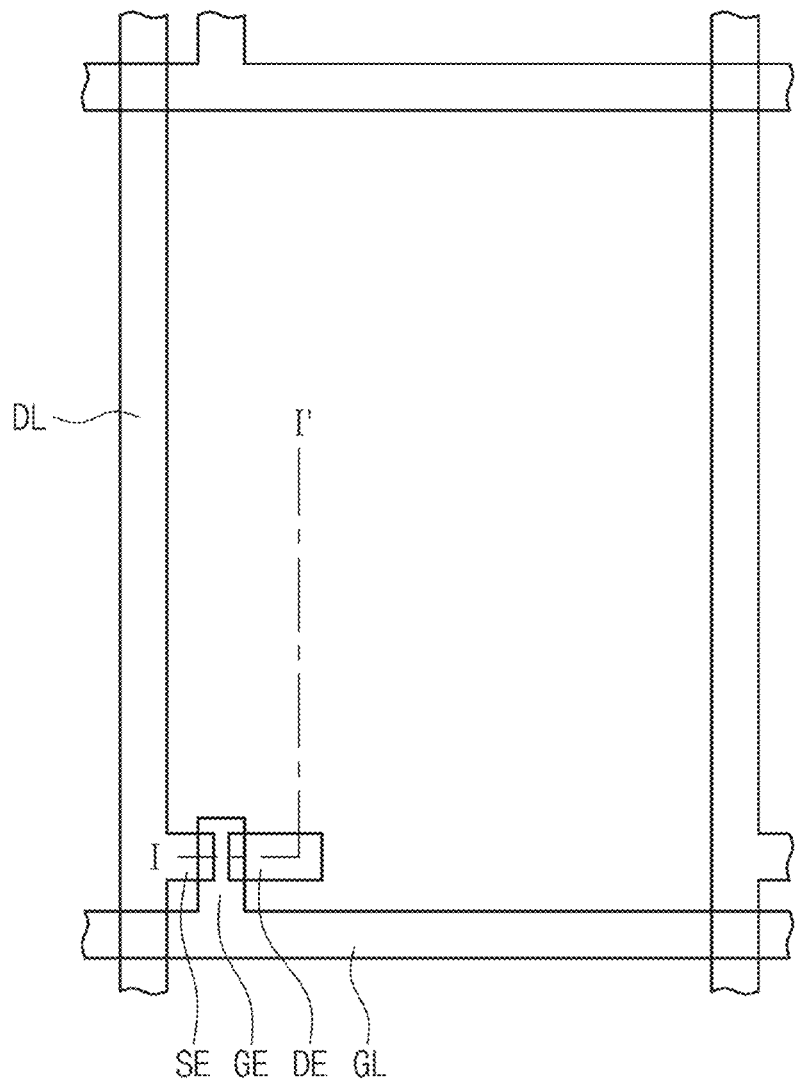
Figure 4C:
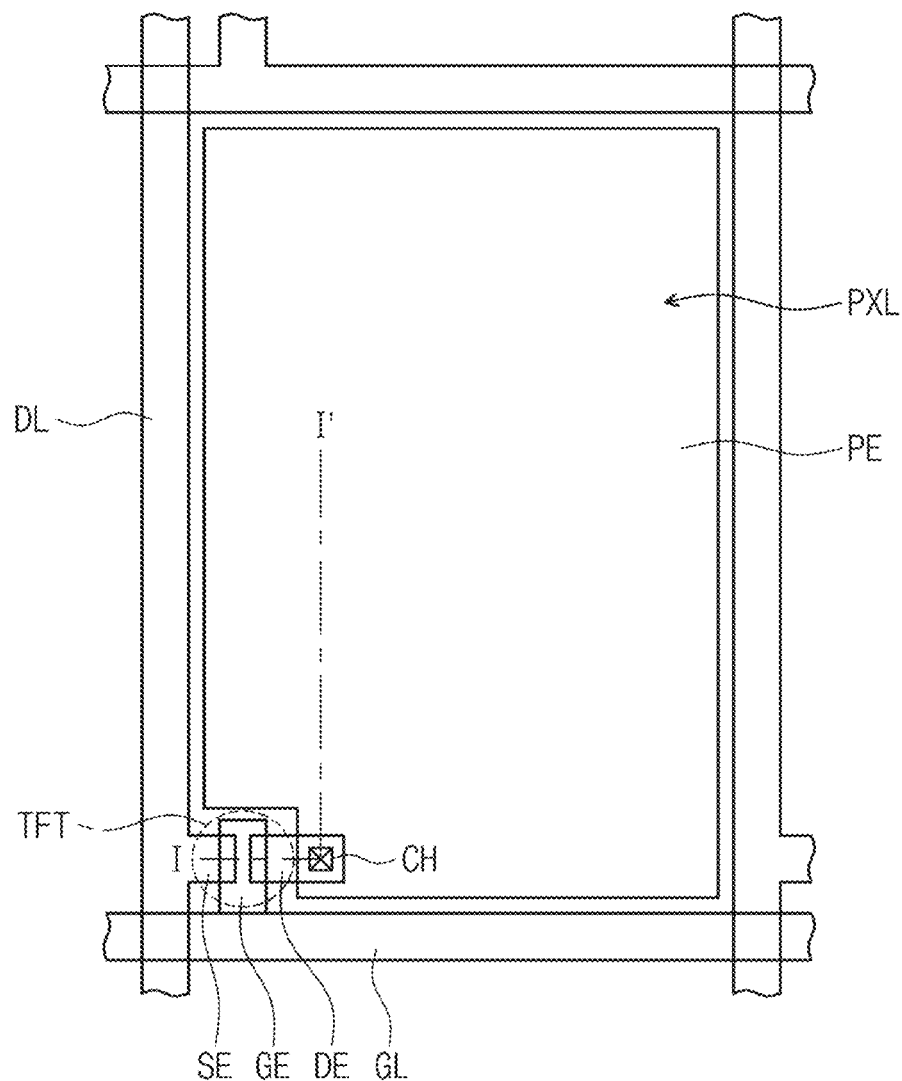
Figure 5A:
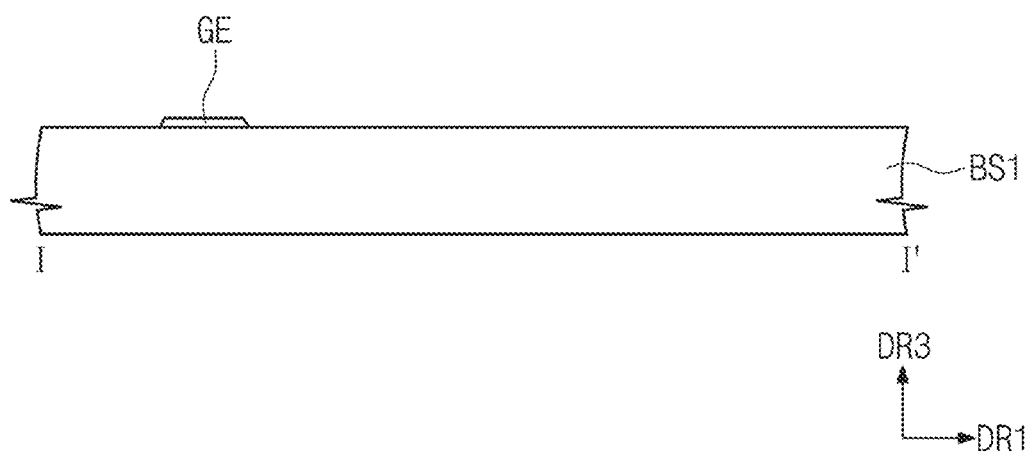
FIGS. 5A-5C are cross-sectional views taken along lines I-I' of FIGS. 4A-4C.
Figure 5B:
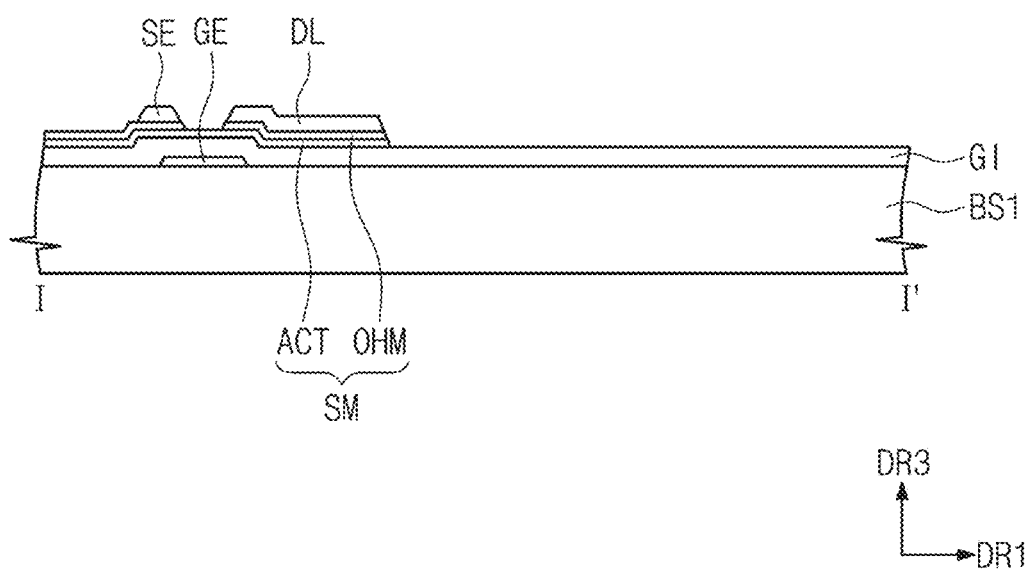
Figure 5C:
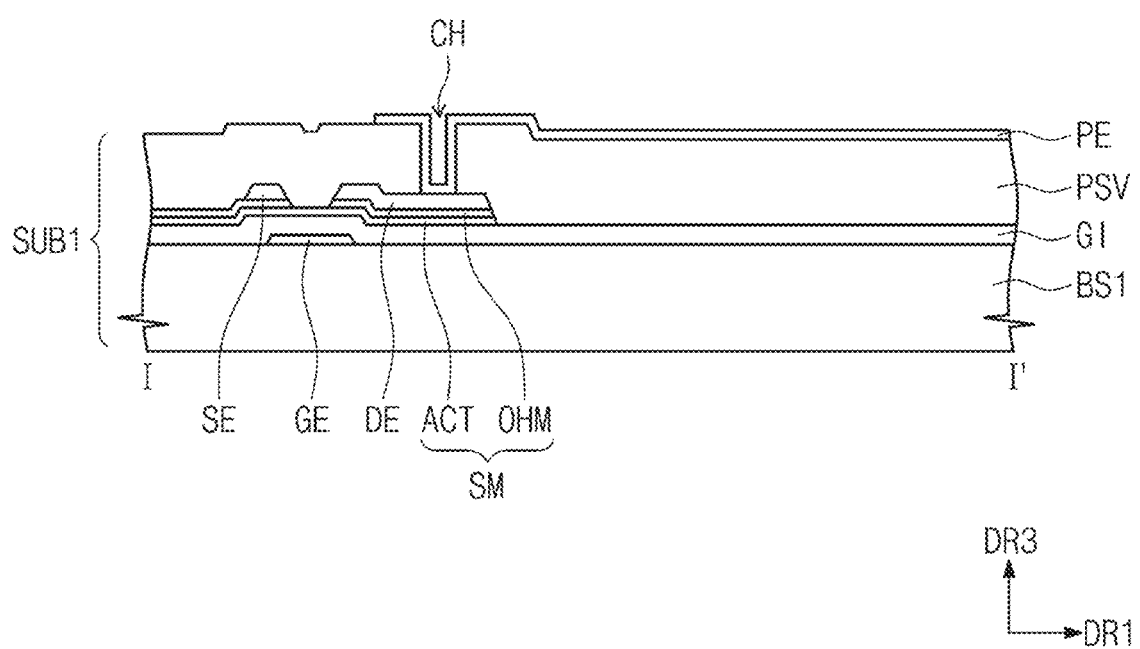

FIG. 4A to FIG. 4C are plan views sequentially showing a manufacturing process of a thin film transistor substrate according to an embodiment of the present disclosure. FIG. 5A to FIG. 5C are cross-sectional views taken along lines I-I' of FIG. 4A to FIG. 4C.

Hereinafter, referring to FIG. 4A to FIG. 4C and FIG. 5A to FIG. 5C, a method for manufacturing a thin film transistor substrate according to an embodiment of the present disclosure will be described.

Referring to FIG. 4A and FIG. 5A, a first wiring part is formed on a first base substrate BS1 utilizing (e.g., using) a first photolithography process. The first wiring part includes a gate line GL extending in a second direction axis DR2, and a gate electrode GE coupled (e.g., connected) to the gate line GL. The gate electrode GE may be formed by applying the method described above with reference to FIG. 1A to FIG. 1E.

Referring to FIG. 4B and FIG. 5B, a gate insulation film GI is formed on the first base substrate BS1 on which the first wiring part is formed, and a semiconductor pattern SM and a second wiring part are formed on the gate insulation film GI utilizing (e.g., using) a second photolithography process. The second wiring part includes a data line DL extending in a first direction axis DR1 crossing or intersecting the second direction axis DR2, a source electrode SE extending from the data line DL, and a drain electrode DE spaced apart from the source electrode SE.

The semiconductor pattern SM and the second wiring part are formed by sequentially forming a first semiconductor material, a second semiconductor material, and first and second metals on the first base substrate BS1, and selectively etching the first semiconductor material, the second semiconductor material, and the first and second metals utilizing (e.g., using) a second mask. The first metal may be made of titanium, and the second metal may be made of copper. The first metal and the second metal may be etched with the above-described etchant composition according to an embodiment of the present disclosure. Accordingly, the data line DL, the source electrode SE, and the drain electrode DE may be formed of a double-layered film structure in which the first metal and the second metal are sequentially laminated. The second mask may be a slit mask or a diffraction mask.

Referring to FIG. 4C and FIG. 5C, utilizing (e.g., using) third and fourth photolithography processes, a pixel electrode PE is formed on the first base substrate BS1 on which the second wiring part is formed.

Referring to FIG. 5C, on the first base substrate BS1 on which the second wiring part is formed, an insulation layer PSV having a contact hole CH for exposing a portion of the drain electrode DE is formed. The insulation layer PSV may be formed, on the first base substrate BS1 on which the second wiring part is formed, by laminating a second insulation material layer utilizing (e.g., using) a second insulation material and a photoresist film, exposing and developing the photoresist film to form a photoresist pattern, and then removing a portion of the second insulation material layer utilizing (e.g., using) the photoresist pattern as a mask.

Referring back to FIG. 5C, by utilizing (e.g., using) the fourth photolithography process, the pixel electrode PE provided on the insulation layer PSV and coupled (e.g., connected) to the drain electrode DE through the contact hole CH is formed. The pixel electrode PE is formed by sequentially laminating a transparent conductive material layer and a photoresist film on the first base substrate BS1 on which the insulation layer PSV is formed, exposing and developing the photoresist film to form a photoresist pattern, and then patterning the transparent conductive material layer utilizing (e.g., using) the photoresist pattern as a mask.

As described above, in the present embodiment, a thin film transistor substrate may be manufactured through a photolithography process. Here, in a photolithography process utilizing (e.g., using) first and second masks, a metal wiring may be formed utilizing (e.g., using) the etchant composition according to an embodiment of the present disclosure. However, forming a wiring part utilizing (e.g., using) the etchant composition is not limited thereto. The etchant composition may be utilized (e.g., used) only when forming a second wiring part utilizing (e.g., using) a second mask, or the etchant composition may be utilized (e.g., used) only when forming a first wiring part utilizing (e.g., using) a first mask. In some embodiments, the etchant composition may be utilized (e.g., used) when forming a wiring other than the first and second wiring parts.

Hereinafter, the etchant composition according to the present disclosure will be described in more detail with reference to Examples and Comparative Examples. However, etchant compositions described in Examples and metal patterns formed utilizing (e.g., using) the etchant composition are only examples, and do not limit the scope of the embodiments.

Preparation of Etchant Composition

Etchant compositions according to Example 1 to Example 40 of the present disclosure, and etchant compositions according to Comparative Example 1 to Comparative Example 20 were prepared in the compositions proposed in Table 1 below. In Table 1, the unit representing the content of each component represents a weight percentage of 100% of the total weight of the etchant composition. In Table 1, when the total weight of the etchant composition is set to 100%, the remaining balance corresponds to water.

TABLE 1

|  | Persulfate | Phosphoric acid | 2-carbonyl ring compound | 3-nitrogen ring compound having a thiol group | Zwitterionic compound 1 (homotaurine) | Zwitterionic compound 2 (sulfamic acid) | 4-nitrogen ring compound | Fluorine compound | Hydrogen sulfate |
|---|---|---|---|---|---|---|---|---|---|
| Example 1 | 15 | 1.5 | 0.3 | 0.2 | 1.5 | 0 | 0.5 | 0.5 | 0.2 |
| Example 2 | 5 | 1.5 | 0.3 | 0.2 | 1.5 | 0 | 0.5 | 0.5 | 0.2 |
| Example 3 | 10 | 1.5 | 0.3 | 0.2 | 1.5 | 0 | 0.5 | 0.5 | 0.2 |
| Example 4 | 18 | 1.5 | 0.3 | 0.2 | 1.5 | 0 | 0.5 | 0.5 | 0.2 |
| Example 5 | 20 | 1.5 | 0.3 | 0.2 | 1.5 | 0 | 0.5 | 0.5 | 0.2 |
| Example 6 | 15 | 0.1 | 0.3 | 0.2 | 1.5 | 0 | 0.5 | 0.5 | 0.2 |
| Example 7 | 15 | 2 | 0.3 | 0.2 | 1.5 | 0 | 0.5 | 0.5 | 0.2 |
| Example 8 | 15 | 3 | 0.3 | 0.2 | 1.5 | 0 | 0.5 | 0.5 | 0.2 |
| Example 9 | 15 | 5 | 0.3 | 0.2 | 1.5 | 0 | 0.5 | 0.5 | 0.2 |
| Example 10 | 15 | 1.5 | 0.01 | 0.2 | 1.5 | 0 | 0.5 | 0.5 | 0.2 |
| Example 11 | 15 | 1.5 | 1 | 0.2 | 1.5 | 0 | 0.5 | 0.5 | 0.2 |
| Example 12 | 15 | 1.5 | 2 | 0.2 | 1.5 | 0 | 0.5 | 0.5 | 0.2 |
| Example 13 | 15 | 1.5 | 0.3 | 0.01 | 1.5 | 0 | 0.5 | 0.5 | 0.2 |
| Example 14 | 15 | 1.5 | 0.3 | 0.1 | 1.5 | 0 | 0.5 | 0.5 | 0.2 |
| Example 15 | 15 | 1.5 | 0.3 | 0.4 | 1.5 | 0 | 0.5 | 0.5 | 0.2 |
| Example 16 | 15 | 1.5 | 0.3 | 1 | 1.5 | 0 | 0.5 | 0.5 | 0.2 |
| Example 17 | 15 | 1.5 | 0.3 | 0.2 | 1 | 0 | 0.5 | 0.5 | 0.2 |
| Example 18 | 15 | 1.5 | 0.3 | 0.2 | 3 | 0 | 0.5 | 0.5 | 0.2 |
| Example 19 | 15 | 1.5 | 0.3 | 0.2 | 1.5 | 0 | 0.1 | 0.5 | 0.2 |
| Example 20 | 15 | 1.5 | 0.3 | 0.2 | 1.5 | 0 | 0.2 | 0.5 | 0.2 |
| Example 21 | 15 | 1.5 | 0.3 | 0.2 | 1.5 | 0 | 0.7 | 0.5 | 0.2 |
| Example 22 | 15 | 1.5 | 0.3 | 0.2 | 1.5 | 0 | 2 | 0.5 | 0.2 |
| Example 23 | 15 | 1.5 | 0.3 | 0.2 | 1.5 | 0 | 0.5 | 0.1 | 0.2 |
| Example 24 | 15 | 1.5 | 0.3 | 0.2 | 1.5 | 0 | 0.5 | 0.2 | 0.2 |
| Example 25 | 15 | 1.5 | 0.3 | 0.2 | 1.5 | 0 | 0.5 | 0.7 | 0.2 |
| Example 26 | 15 | 1.5 | 0.3 | 0.2 | 1.5 | 0 | 0.5 | 0.9 | 0.2 |
| Example 27 | 15 | 1.5 | 0.3 | 0.2 | 1.5 | 0 | 0.5 | 0.5 | 0.1 |
| Example 28 | 15 | 1.5 | 0.3 | 0.2 | 1.5 | 0 | 0.5 | 0.5 | 0.5 |
| Example 29 | 15 | 1.5 | 0.3 | 0.2 | 1 | 0 | 0.5 | 0.5 | 0.5 |
| Example 30 | 15 | 1.5 | 0.3 | 0.2 | 2 | 0 | 0.5 | 0.5 | 0.25 |
| Example 31 | 15 | 1.5 | 0.3 | 0.2 | 3 | 0 | 0.5 | 0.5 | 0.1 |
| Example 32 | 20 | 1.5 | 0.3 | 0.2 | 1 | 0 | 0.5 | 0.5 | 0.2 |

TABLE 1-continued

| | Persulfate | Phosphoric acid | 2-carbonyl ring compound | 3-nitrogen ring compound having a thiol group | Zwitterionic compound 1 (homotaurine) | Zwitterionic compound 2 (sulfamic acid) | 4-nitrogen ring compound | Fluorine compound | Hydrogen sulfate |
|---|---|---|---|---|---|---|---|---|---|
| Example 33 | 10 | 1.5 | 0.3 | 0.2 | 2 | 0 | 0.5 | 0.5 | 0.2 |
| Example 34 | 5 | 1.5 | 0.3 | 0.2 | 3 | 0 | 0.5 | 0.5 | 0.2 |
| Example 35 | 15 | 1.5 | 0.3 | 0.2 | 0 | 1 | 0.5 | 0.5 | 0.5 |
| Example 36 | 15 | 1.5 | 0.3 | 0.2 | 0 | 2 | 0.5 | 0.5 | 0.25 |
| Example 37 | 15 | 1.5 | 0.3 | 0.2 | 0 | 3 | 0.5 | 0.5 | 0.1 |
| Example 38 | 20 | 1.5 | 0.3 | 0.2 | 0 | 1 | 0.5 | 0.5 | 0.2 |
| Example 39 | 10 | 1.5 | 0.3 | 0.2 | 0 | 2 | 0.5 | 0.5 | 0.2 |
| Example 40 | 5 | 1.5 | 0.3 | 0.2 | 0 | 3 | 0.5 | 0.5 | 0.2 |
| Comparative Example 1 | 3 | 1.5 | 0.3 | 0.2 | 1.5 | 0 | 0.5 | 0.5 | 0.2 |
| Comparative Example 2 | 22 | 1.5 | 0.3 | 0.2 | 1.5 | 0 | 0.5 | 0.5 | 0.2 |
| Comparative Example 3 | 15 | 0.05 | 0.3 | 0.2 | 1.5 | 0 | 0.5 | 0.5 | 0.2 |
| Comparative Example 4 | 15 | 6 | 0.3 | 0.2 | 1.5 | 0 | 0.5 | 0.5 | 0.2 |
| Comparative Example 5 | 15 | 1.5 | 0.005 | 0.2 | 1.5 | 0 | 0.5 | 0.5 | 0.2 |
| Comparative Example 6 | 15 | 1.5 | 2.3 | 0.2 | 1.5 | 0 | 0.5 | 0.5 | 0.2 |
| Comparative Example 7 | 15 | 1.5 | 0.3 | 0.005 | 1.5 | 0 | 0.5 | 0.5 | 0.2 |
| Comparative Example 8 | 15 | 1.5 | 0.3 | 1.2 | 1.5 | 0 | 0.5 | 0.5 | 0.2 |
| Comparative Example 9 | 15 | 1.5 | 0.3 | 0.2 | 0.3 | 0 | 0.5 | 0.5 | 0.2 |
| Comparative Example 10 | 15 | 1.5 | 0.3 | 0.2 | 5 | 0 | 0.5 | 0.5 | 0.2 |
| Comparative Example 11 | 15 | 1.5 | 0.3 | 0.2 | 1.5 | 0 | 0.05 | 0.5 | 0.2 |
| Comparative Example 12 | 15 | 1.5 | 0.3 | 0.2 | 1.5 | 0 | 2.5 | 0.5 | 0.2 |
| Comparative Example 13 | 15 | 1.5 | 0.3 | 0.2 | 1.5 | 0 | 0.5 | 0.05 | 0.2 |
| Comparative Example 14 | 15 | 1.5 | 0.3 | 0.2 | 1.5 | 0 | 0.5 | 1.1 | 0.2 |
| Comparative Example 15 | 15 | 1.5 | 0.3 | 0.2 | 1.5 | 0 | 0.5 | 0.5 | 0.03 |
| Comparative Example 16 | 15 | 1.5 | 0.3 | 0.2 | 1.5 | 0 | 0.5 | 0.5 | 1 |
| Comparative Example 17 | 21 | 1.5 | 0.3 | 0.2 | 1 | 0 | 0.5 | 0.5 | 0.2 |
| Comparative Example 18 | 25 | 1.5 | 0.3 | 0.2 | 1 | 0 | 0.5 | 0.5 | 0.2 |
| Comparative Example 19 | 21 | 1.5 | 0.3 | 0.2 | 0 | 1 | 0.5 | 0.5 | 0.2 |
| Comparative Example 20 | 25 | 1.5 | 0.3 | 0.2 | 0 | 1 | 0.5 | 0.5 | 0.2 |

In each of Examples and Comparative Examples presented in Table 1, ammonium persulfate was utilized (e.g., used) as persulfate, aminotetrazole was utilized (e.g., used) as a 4-nitrogen ring compound, hydantoin was utilized (e.g., used) as a carbonyl ring compound, ammonium bifluoride was utilized (e.g., used) as a fluorine compound, 3-Amino-1,2,4-triazole-5-thiol was utilized (e.g., used) as a 3-nitrogen ring compound, sodium hydrogen sulfate was utilized (e.g., used) as hydrogen sulfate, and homotaurine and sulfamic acid were selected and utilized (e.g., used) as a zwitterionic compound.

Manufacturing Evaluation of Metal Pattern

Utilizing (e.g., using) the etchant compositions proposed in Table 1, an etch test for a double-layered film including a titanium metal film and a copper metal film was conducted. The etch test was performed by providing the etchant compositions of Examples and Comparative Examples to a double-layered film including a titanium metal film of 200 Å and a copper metal film of 6000 Å under the temperature condition of 26° C., and then evaluating an etch amount accumulation level, an initial taper angle, and maintenance of a taper angle based on 100% overetching point of time which is twice the time taken until the upper copper layer and the titanium layer are completely etched (EPD time, end point detection time). The etch amount accumulation level determines whether etch quality is maintained in accordance with the increase in copper content in an etchant composition caused by the reuse of an etchant.

Table 2 below shows etch quality evaluation results in Examples and Comparative Examples. Table 2 shows an etch amount accumulation level, an initial taper angle, and maintenance of a taper angle, respectively, when a metal pattern was manufactured utilizing (e.g., using) the etchant compositions of Examples and Comparative Examples. The evaluation criteria for an etch amount accumulation level, an initial taper angle, and maintenance of a taper angle were based on the following. In addition, Table 2 shows comprehensive evaluation results by combining scores for excellent, average, and poor with respect to each item of the etch amount accumulation level, initial taper angle, and maintenance of a taper angle.

Evaluation Criteria for Etch Amount Accumulation Level
- ○ (Excellent): Etch quality is good even when 6000 ppm or more of Cu ions are included.
- Δ (Average): Etch quality is good until 4000 ppm to less than 6000 ppm of Cu ions are included.
- x (Poor): Etch quality is good until less than 4000 ppm of Cu ions are included.

Evaluation Criteria for Initial Taper Angle
- ○ (Excellent): 40 degrees to less than 50 degrees.
- Δ (Average): 30 degrees to less than 40 degrees, 50 degrees to less than 60 degrees.
- x (Poor): Less than 30 degrees, greater than 60 degrees.

Evaluation Criteria for Taper Angle Maintenance
- ○ (Excellent): When the change in taper angle is less than 5° while Cu ions become at 6000 ppm.
- x (Poor): When the change in taper angle is 5° or more while Cu ions become at 6000 ppm.

In addition, FIG. 6 shows scanning electron microscope (SEM) images of cross-sections after an etching process is performed for Comparative Example 1 to Comparative Example 20. In FIG. 6, "Cu 0 ppm" and "Cu 6000 ppm" respectively correspond to the case in which when the etchant composition was utilized (e.g., used) for the first time and the case in which the etchant composition was utilized (e.g., used) until the concentration of Cu ions became 6000 ppm.

TABLE 2

|  | Etch amount accumulation level | Initial taper angle | Taper angle maintenance |
| --- | --- | --- | --- |
| Example 1 | ○ | ○ | ○ |
| Example 2 | ○ | ○ | ○ |
| Example 3 | ○ | ○ | ○ |
| Example 4 | ○ | ○ | ○ |
| Example 5 | ○ | ○ | ○ |
| Example 6 | ○ | ○ | ○ |
| Example 7 | ○ | ○ | ○ |
| Example 8 | ○ | ○ | ○ |
| Example 9 | ○ | ○ | ○ |
| Example 10 | ○ | ○ | ○ |
| Example 11 | ○ | ○ | ○ |
| Example 12 | ○ | ○ | ○ |
| Example 13 | ○ | ○ | ○ |
| Example 14 | ○ | ○ | ○ |
| Example 15 | ○ | ○ | ○ |
| Example 16 | ○ | ○ | ○ |
| Example 17 | ○ | ○ | ○ |
| Example 18 | ○ | ○ | ○ |
| Example 19 | ○ | ○ | ○ |
| Example 20 | ○ | ○ | ○ |
| Example 21 | ○ | ○ | ○ |
| Example 22 | ○ | ○ | ○ |
| Example 23 | ○ | ○ | ○ |
| Example 24 | ○ | ○ | ○ |
| Example 25 | ○ | ○ | ○ |
| Example 26 | ○ | ○ | ○ |
| Example 27 | ○ | ○ | ○ |
| Example 28 | ○ | ○ | ○ |
| Example 29 | ○ | ○ | ○ |
| Example 30 | ○ | ○ | ○ |
| Example 31 | ○ | ○ | ○ |
| Example 32 | ○ | ○ | ○ |
| Example 33 | ○ | ○ | ○ |
| Example 34 | ○ | ○ | ○ |
| Example 35 | ○ | ○ | ○ |
| Example 36 | ○ | ○ | ○ |
| Example 37 | ○ | ○ | ○ |
| Example 38 | ○ | ○ | ○ |
| Example 39 | ○ | ○ | ○ |
| Example 40 | ○ | ○ | ○ |
| Comparative Example 1 | X | Δ | X |
| Comparative Example 2 | ○ | X | X |
| Comparative Example 3 | ○ | X | X |
| Comparative Example 4 | ○ | X | ○ |
| Comparative Example 5 | X | ○ | X |
| Comparative Example 6 | X | ○ | Δ |
| Comparative Example 7 | X | ○ | X |
| Comparative Example 8 | Δ | ○ | Δ |
| Comparative Example 9 | X | Δ | X |
| Comparative Example 10 | Δ | X | Δ |
| Comparative Example 11 | Δ | X | X |
| Comparative Example 12 | Δ | Δ | X |
| Comparative Example 13 | X | X | X |
| Comparative Example 14 | X | X | X |
| Comparative Example 15 | Δ | Δ | Δ |
| Comparative Example 16 | ○ | X | Δ |
| Comparative Example 17 | ○ | X | Δ |
| Comparative Example 18 | ○ | X | Δ |
| Comparative Example 19 | ○ | X | Δ |
| Comparative Example 20 | ○ | X | Δ |

Referring to the results of Table 2, Comparative Examples 1 to 14, and 16 to 20 were poor in at least one evaluation, Comparative Example 15 were average in three evaluations, whereas Examples 1 to 40 were all excellent based on the three evaluation criteria. That is, it can be confirmed that the etchant composition according to an embodiment exhibits good etch amount accumulation level, initial taper angle, and taper angle maintenance properties.

From the results of Comparative Examples 1 to 20, it can be confirmed that compared to Examples, the etch quality was degraded in Comparative Examples 1 to 20 in which at least one among the evaluation items of the etchant composition was not satisfied.

For example, Comparative Example 1 includes a trace amount of persulfate, so that the copper etch speed is slow, and as the amount of copper ions increases, the etch quality is not good.

Comparative Example 2 includes an excessive amount of persulfate, so that the initial taper angle is high, and the etch speed is too fast to control process tack time.

Comparative Example 3 includes a trace amount of phosphoric acid, and thus, the etch speed of a lower titanium film increases, so that the initial taper angle is high and a taper angle is not maintained.

Comparative Example 4 includes an excessive amount of phosphoric acid, and thus, the initial taper angle is very low and a titanium tail is formed long.

Comparative Example 5 includes a trace amount of a carbonyl ring compound, and thus, there is no sulfate radical stabilizing effect, so that as the amount of copper ions increases the etch quality is not good.

Comparative Example 16 includes an excessive amount of hydrogen sulfate, so that an initial taper angle becomes high.

In Comparative Examples 17 to 20, when persulfate is greater than 20 in the ratio to homotaurine or sulfamic acid, an initial taper angle becomes high due to an increase in the ratio of persulfate.

TABLE 3

| | Persulfate | Phosphoric acid | 2-carbonyl ring compound | 3-nitrogen ring compound having a thiol group | Zwitterionic compound 1 (homotaurine) | Zwitterionic compound 2 (sulfamic acid) | 4-nitrogen ring compound | Fluorine compound | Hydrogen sulfate |
|---|---|---|---|---|---|---|---|---|---|
| Example 1 | 15 | 1.5 | 0.3 | 0.2 | 1.5 | 0 | 0.5 | 0.5 | 0.2 |
| Example 41 | 15 | 1.5 | 0.3 | 0.2 | 2.7 | 0 | 0.5 | 0.5 | 0.1 |
| Example 42 | 15 | 1.5 | 0.3 | 0.2 | 2.9 | 0 | 0.5 | 0.5 | 0.1 |
| Example 43 | 15 | 1.5 | 0.3 | 0.2 | 0 | 2.7 | 0.5 | 0.5 | 0.1 |
| Example 44 | 15 | 1.5 | 0.3 | 0.2 | 0 | 2.9 | 0.5 | 0.5 | 0.1 |
| Comparative Example 21 | 5 | 1.5 | 0.3 | 0.2 | 3.3 | 0 | 0.5 | 0.5 | 0.2 |
| Comparative Example 22 | 5 | 1.5 | 0.3 | 0.2 | 5 | 0 | 0.5 | 0.5 | 0.2 |
| Comparative Example 23 | 5 | 1.5 | 0.3 | 0.2 | 0 | 3.3 | 0.5 | 0.5 | 0.2 |
| Comparative Example 24 | 5 | 1.5 | 0.3 | 0.2 | 0 | 5 | 0.5 | 0.5 | 0.2 |

Comparative Example 6 includes an excessive amount of a carbonyl ring compound and the carbonyl ring compound is adsorbed to copper, so that as the amount of copper ions increases, the etch quality is not good.

Comparative Example 7 includes a trace amount of a 3-nitrogen ring compound, and thus, there is no oxygen radical stabilizing effect, so that as the amount of copper ions increases, the etch quality is not good.

Comparative Example 8 includes an excessive amount of a 3-nitrogen ring compound and the 3-nitrogen ring compound is adsorbed to copper, so that as the amount of copper ions increases, the etch quality is not good.

Comparative Example 9 includes a trace amount of homotaurine, and thus, there is not enough strong oxidization agent, so that as the amount of copper ions increases, the etch quality is not good.

Comparative Example 10 includes an excessive amount of homotaurine, and thus, the initial taper angle is high and the decomposition of persulfate is promoted, so that as the amount of copper ions increases, the etch quality is not good.

Comparative Example 11 includes a trace amount a 4-nitrogen ring compound, and thus, an initial taper angle becomes high due to an increase in copper etch speed.

Comparative Example 12 includes an excessive amount of a 4-nitrogen ring compound, and thus, the copper etch rate is low and the 4-nitrogen ring compound is adsorbed to copper, so that as the amount of copper ions increases, the etch quality is not good.

Comparative Example 13 includes a trace amount of a fluorine compound, and thus, the etching of a lower titanium film is performed very slow, so that productivity is degraded due to an increase in tact-time.

Comparative Example 14 includes an excessive amount of a fluorine compound, so that an undercut and damage to a glass substrate due to the overetching of a lower titanium film is increased.

Comparative Example 15 includes a trace amount hydrogen sulfate, and thus, has an insignificant effect of slowing down the decomposition speed of persulfate by hydrogen sulfate, and is poor in copper treatment capacity.

If the ratio between components is not appropriate, the decomposition of persulfate is promoted, resulting in the degradation of performance due to storage. The case in which the ratio is not appropriate refers to a case in which a zwitterionic compound is greater than 25 in the ratio to hydrogen sulfate (e.g., when a ratio (e.g., weight ratio) of the zwitterionic compound to the hydrogen sulfate is greater than 25:1), and a case in which the ratio of persulfate and the zwitterionic compound is less than 1:1.6 (e.g., when a ratio (e.g., weight ratio) of the zwitterionic compound to the persulfate is less than 1:1.6).

Examples 1 and 41 to 44 and Comparative Examples 21 to 24 having each component content condition according to Table 3 were evaluated for decomposition degree of persulfate according to storage. Persulfate is decomposed in water through a chemical reaction represented by Formula 1 below. When a strong acid is added to the persulfate and water, the decomposition of persulfate is promoted, causing the performance degradation of an etchant composition.

$$(NH_4)_2S_2O_8 + H_2O \rightarrow 2NH_4^+ + HSO_4^- + HSO_5^-$$ [Formula 1]

TABLE 4

| | Concentration of persulfate after 3 days of storage (weight percentage %) |
|---|---|
| Example 1 | 99.56 |
| Example 41 | 98.86 |
| Example 42 | 98.47 |
| Example 43 | 98.75 |
| Example 44 | 98.25 |
| Comparative Example 21 | 98.10 |
| Comparative Example 22 | 95.94 |
| Comparative Example 23 | 98.02 |
| Comparative Example 24 | 95.91 |

Table 4 shows the results of decreased content of persulfate when stored for three days under the condition of 10±1° C. Meanwhile, a decrease of more than 1% on a percentage basis of persulfate may cause performance degradation.

Compared to other Examples or Comparative Examples, Example 1 had the least decrease in persulfate.

In the case of Examples 41 to 44, it can be seen that when homotaurine or sulfamic acid is greater than 25 in the ratio to hydrogen sulfate, the decomposition of persulfate becomes severe, and as the content of homotaurine and sulfamic acid increases, the decomposition becomes more severe.

In the case of Comparative Examples 21 to 24, it can be seen that when persulfate is less than 1.6 in the ratio to homotaurine or sulfamic acid (e.g., when the ratio of persulfate to homotaurine or sulfamic acid is less than 1.6:1), the decomposition of persulfate becomes severe, and as the content of homotaurine and sulfamic acid increases, the decomposition becomes more severe.

Figure 7A:
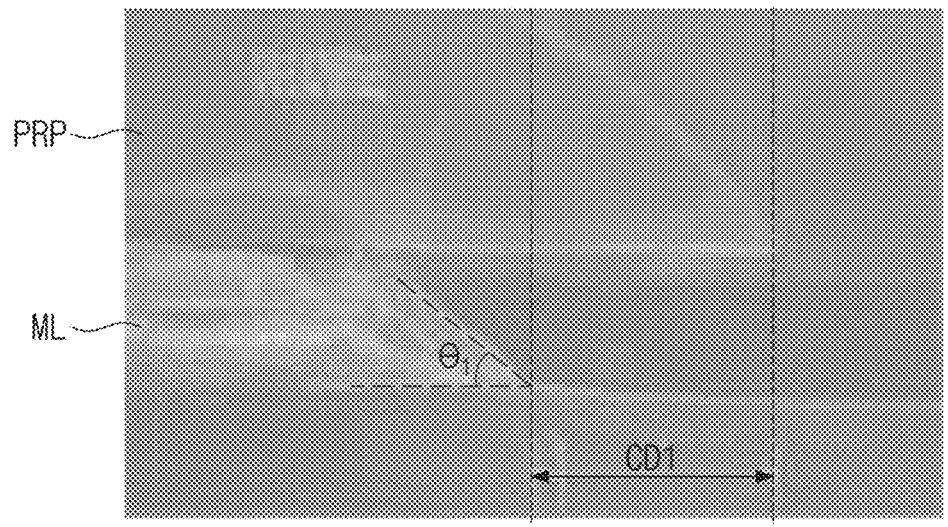
FIG. 7A and FIG. 7B are scanning electron microscope (SEM) images showing a side surface of a metal film etched with the etchant of Example 1 and Comparative Example 2, respectively.
Figure 7B:
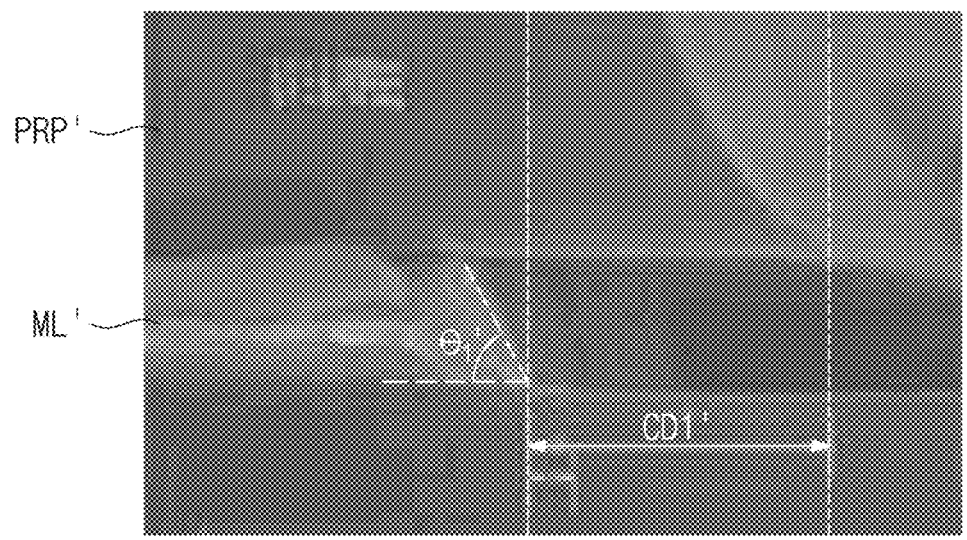

FIG. 7A and FIG. 7B show scanning electron microscope images after an etching process is performed in Example 1 and Comparative Example 2, respectively. FIG. 7A and FIG. 7B show images for cross-sections of metal patterns ML and ML' formed below photoresist patterns PRP and PRP'. When comparing FIG. 7A and FIG. 7B, it can be confirmed that a one-side CD skew CD1 of the metal pattern ML of the Example 1 is smaller than a one-side CD skew CD1' of the metal pattern ML' of the Comparative Example 2, and a taper angle $\theta_1$ of the metal pattern ML of the Example 1 is smaller than a taper angle $\theta_1'$ of the metal pattern ML' of the Comparative Example 2. From the above, it can be confirmed that the Example 1 formed a good metal pattern with a small CD skew value and a small taper angle compared to the Comparative Example 2.

Figure 8:
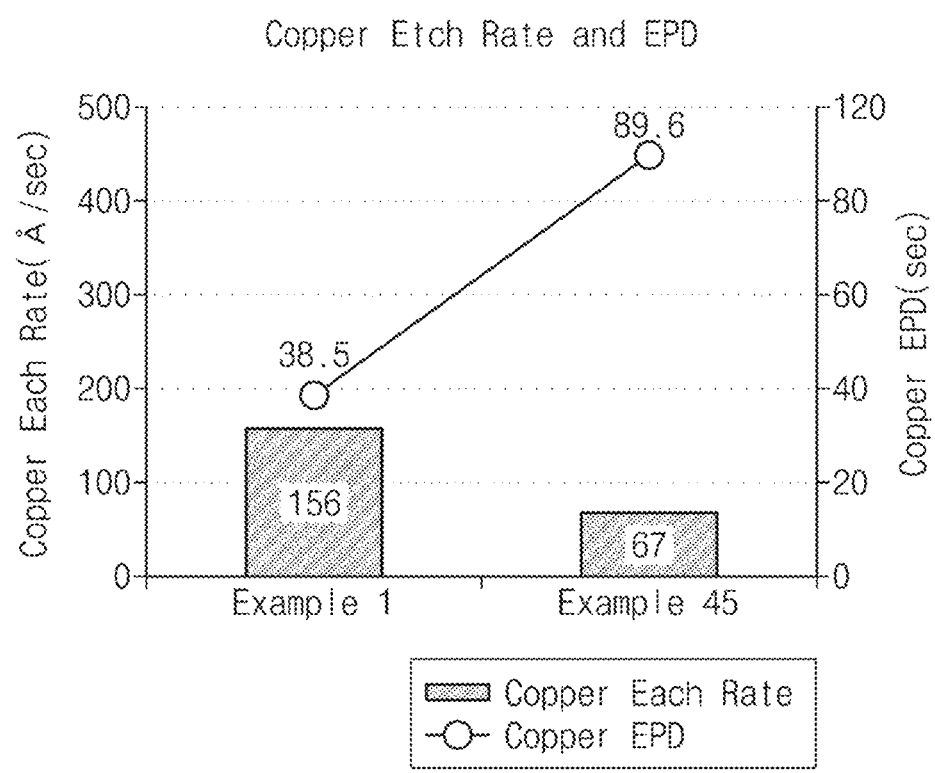
FIG. 8 is a graph illustrating measured copper etch rates of Example 1 and Example 45.

FIG. 8 is a graph illustrating measured copper etch rates of Example 1 and Example 45. Meanwhile, as shown in Table 5, Example 1 includes a zwitterionic compound (homotaurine) having a sulfo group, and Example 45 includes a zwitterionic compound (glutamic acid) having a carboxyl group.

TABLE 5

| Examples | Persulfate | Phosphoric acid | Carbonyl ring compound | 3-nitrogen ring compound | Zwitterionic compound (sulfo group) | Zwitterionic compound (carboxyl group) | 4-nitrogen ring compound | Fluorine compound | Hydrogen sulfate |
|---|---|---|---|---|---|---|---|---|---|
| Example 1 | 15 | 1.5 | 0.3 | 0.2 | 1.5 | 0 | 0.5 | 0.5 | 0.2 |
| Example 45 | 15 | 1.5 | 0.3 | 0.2 | 0 | 1.5 | 0.5 | 0.5 | 0.2 |

Homotaurine is a strong oxidizing agent with a high $H^+$ ion dissociation, a component which increases a copper etch rate. When glutamic acid is utilized (e.g., used), glutamic acid is adsorbed on the surface of copper due to a copper chelating effect due to the amino group and the carboxyl group to rapidly decrease a copper etch rate, so that the productivity of a product is degraded due to an increase of the process tact time (including copper EPD according to etch rate).

The etchant composition of an embodiment may be utilized (e.g., used) for batch etching of a multi-layered metal film of a titanium metal film and a copper metal film, and may maintain stable etching properties even when utilized (e.g., used) repeatedly. In addition, the etchant composition of an embodiment also maintains a taper angle, which is an etching characteristic of a metal pattern, at a set or predetermined level or below, exhibits a high etch amount accumulation level, and maintains a good taper angle, thereby exhibiting excellent etch performance. In addition, it can be confirmed that a metal pattern and a thin film transistor substrate manufactured utilizing (e.g., using) the etchant composition of an embodiment have good taper profile.

According to the etchant composition in accordance with an embodiment of the present disclosure, the generation of environmentally regulated materials may be suppressed (reduced), and etch properties such as a taper angle and a critical dimension (CD) skew may be improved.

A method for manufacturing a metal pattern according to an embodiment of the present disclosure may reduce the occurrence of electric shorts and wiring defects.

A method for manufacturing a thin film transistor substrate according to an embodiment of the present disclosure may reduce manufacturing time and cost.

Although aspects of some embodiments of the present disclosure have been illustrated and described, it will be understood by those skilled in the art that various suitable modifications and changes in form and details may be made therein without departing from the spirit and scope of embodiments according to the present disclosure as set forth in the following claims and equivalents thereof.

Accordingly, the technical scope of embodiments according to the present disclosure is not intended to be limited to the contents set forth in the detailed description of the specification, but is intended to be defined by the appended claims, and their equivalents.

What is claimed is:

1. An etchant composition comprising:
   about 5 wt % to about 20 wt % of persulfate;
   about 0.1 wt % to about 5 wt % of phosphoric acid and/or phosphate;
   about 0.01 wt % to about 2 wt % of a carbonyl ring compound;
   about 0.01 wt % to about 1 wt % of a 3-nitrogen ring compound;
   about 0.1 wt % to about 2 wt % of a 4-nitrogen ring compound;
   about 0.1 wt % to about 0.9 wt % of a fluorine compound;
   about 0.1 wt % to about 0.5 wt % of hydrogen sulfate;
   about 1 wt % to about 3 wt % of a zwitterionic compound; and
   water which is comprised in an amount that makes the total weight of the entire etchant composition about 100 wt %,
   wherein a weight ratio of the zwitterionic compound and the persulfate is about 1:10 to about 1:20 or about 1:3 to 1:8,
   wherein a weight ratio of the hydrogen sulfate to the zwitterionic compound is 1:10 to 1:20, and
   wherein the zwitterionic compound comprises at least one of aminomethanesulfonic acid, taurine, or homotaurine.

2. The etchant composition of claim 1, wherein the carbonyl ring compound comprises at least two carbonyl groups forming a ring.

3. The etchant composition of claim 2, wherein the carbonyl ring compound comprises at least one of thiazolidinedione, hydantoin, or succinimide.

4. The etchant composition of claim 1, wherein the 3-nitrogen ring compound is a triazole comprising at least one thiol group as a substituent.

5. The etchant composition of claim 4, wherein the 3-nitrogen ring compound comprises at least one of 3-Mercapto-4-methyl-4H-1,2,4-triazole, 3-Amino-1,2,4-triazole-5-thiol, or 1H-1,2,4-triazole-3-thiol.

6. The etchant composition of claim 1, wherein the persulfate comprises at least one of potassium persulfate ($K_2S_2O_8$), sodium persulfate ($Na_2S_2O_8$), or ammonium persulfate (($NH_4)_2S_2O_8$).

7. The etchant composition of claim 1, wherein the 4-nitrogen ring compound comprises at least one of aminotetrazole, methyltetrazole, or mercaptomethyltetrazole.

8. The etchant composition of claim 1, wherein the fluorine compound comprises at least one of hydrofluoric acid (HF), ammonium fluoride ($NH_4F$), potassium fluoride (KF), sodium fluoride (NaF), ammonium bifluoride ($F_2H_5N$), potassium bifluoride ($KHF_2$), or sodium bifluoride ($NaHF_2$).

9. The etchant composition of claim 1, wherein the hydrogen sulfate comprises at least one of ammonium hydrogen sulfate ($NH_4HSO_4$), lithium hydrogen sulfate ($LiHSO_4$), potassium hydrogen sulfate ($KHSO_4$), or sodium hydrogen sulfate ($NaHSO_4$).

10. The etchant composition of claim 1, wherein the etchant composition is to etch a multi-layered film comprising a titanium film and a copper film.

11. A method for manufacturing a metal pattern, the method comprising:
forming a metal film;
forming a photoresist pattern on the metal film;
providing an etchant composition on the metal film on which the photoresist pattern is formed; and
removing the photoresist pattern,
wherein the etchant composition comprises:
about 5 wt % to about 20 wt % of persulfate;
about 0.1 wt % to about 5 wt % of phosphoric acid and/or phosphate;
about 0.01 wt % to about 2 wt % of a carbonyl ring compound;
about 0.01 wt % to about 1 wt % of a 3-nitrogen ring compound;
about 0.1 wt % to about 2 wt % of a 4-nitrogen ring compound;
about 0.1 wt % to about 0.9 wt % of a fluorine compound;
about 0.1 wt % to about 0.5 wt % of hydrogen sulfate;
about 1 wt % to about 3 wt % of a zwitterionic compound; and
water which is comprised in an amount that makes the total weight of the entire etchant composition about 100 wt %,
wherein a weight ratio of the zwitterionic compound to the persulfate is about 1:10 to about 1:20 or about 1:3 to about 1:8,
wherein a weight ratio of the hydrogen sulfate to the zwitterionic compound is 1:10 to 1:20,
wherein the zwitterionic compound comprises at least one of aminomethanesulfonic acid, taurine, or homotaurine.

12. The method of claim 11, wherein the forming of a metal film comprises:
forming a first metal film containing titanium; and
forming a second metal film containing copper on the first metal film.

13. The method of claim 11, wherein the carbonyl ring compound comprises at least two carbonyl groups forming a ring.

14. The method of claim 13, wherein the carbonyl ring compound comprises at least one of thiazolidinedione, hydantoin, or succinimide.

15. The method of claim 11, wherein the 3-nitrogen ring compound is a triazole comprising at least one thiol group as a substituent.

16. A method for manufacturing a thin film transistor substrate, the method comprising:
forming on a substrate a gate line and a gate electrode coupled to the gate line;
forming a data line crossing the gate line while being insulated therefrom, a source electrode coupled to the data line, and a drain electrode spaced apart from the source electrode; and
forming a pixel electrode coupled to the drain electrode,
wherein the forming of the gate line and the gate electrode comprises:
forming a metal film containing titanium and copper;
forming a photoresist pattern on the metal film;
providing an etchant composition on the metal film on which the photoresist pattern is formed; and
removing the photoresist pattern,
wherein the etchant composition comprises:
about 5 wt % to about 20 wt % of persulfate;
about 0.1 wt % to about 5 wt % of phosphoric acid and/or phosphate;
about 0.01 wt % to about 2 wt % of a carbonyl ring compound;
about 0.01 wt % to about 1 wt % of a 3-nitrogen ring compound;
about 0.1 wt % to about 2 wt % of a 4-nitrogen ring compound;
about 0.1 wt % to about 0.9 wt % of a fluorine compound;
about 0.1 wt % to about 0.5 wt % of hydrogen sulfate;
about 1 wt % to about 3 wt % of a zwitterionic compound; and
water which is comprised in an amount that makes the total weight of the entire etchant composition about 100 wt %,
wherein a weight ratio of the zwitterionic compound to the persulfate is about 1:10 to about 1:20 or about 1:3 to about 1:8,
wherein a weight ratio of the hydrogen sulfate to the zwitterionic compound is 1:10 to 1:20, and
wherein the zwitterionic compound comprises at least one of aminomethanesulfonic acid, taurine, or homotaurine.

17. The method of claim 16, wherein the forming of a metal film comprises:
forming a first metal film containing titanium; and
forming a second metal film containing copper on the first metal film.

* * * * *